(12) United States Patent
Takamori et al.

(10) Patent No.: US 6,635,113 B2
(45) Date of Patent: Oct. 21, 2003

(54) COATING APPARATUS AND COATING METHOD

(75) Inventors: Hideyuki Takamori, Kumamoto-ken (JP); Noriyuki Anai, Kumamoto-ken (JP); Masafumi Nomura, Kumamoto-ken (JP); Kiyohisa Tateyama, Kumamoto-ken (JP); Tsutae Omori, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/313,860

(22) Filed: May 18, 1999

(65) Prior Publication Data

US 2002/0152954 A1 Oct. 24, 2002

(30) Foreign Application Priority Data

May 19, 1998 (JP) .............................. 10-137019
May 28, 1998 (JP) .............................. 10-148007

(51) Int. Cl.⁷ .............................................. B05C 11/10
(52) U.S. Cl. ...................... 118/681; 118/692; 118/712; 118/52
(58) Field of Search .............................. 118/52, 54, 57, 118/315, 320, 321, 323, 695, 704, 63, 677, 681, 692, 712; 427/240, 425

(56) References Cited

U.S. PATENT DOCUMENTS

| | | | |
|---|---|---|---|
| 5,374,312 A | | 12/1994 | Hasebe et al. |
| 5,658,615 A | | 8/1997 | Hasebe et al. |
| 5,772,764 A | * | 6/1998 | Akimoto ..................... 118/319 |
| 5,826,129 A | * | 10/1998 | Hasebe et al. .............. 396/611 |
| 5,871,584 A | * | 2/1999 | Tateyama et al. ........... 118/319 |
| 5,935,331 A | * | 8/1999 | Naka et al. .................... 118/63 |
| 6,019,844 A | * | 2/2000 | Chiu ............................. 118/52 |
| 6,178,580 B1 | * | 1/2001 | Ishihara et al. ............... 15/102 |
| 6,207,231 B1 | * | 3/2001 | Tateyama .................... 427/240 |

* cited by examiner

*Primary Examiner*—Richard Crispino
*Assistant Examiner*—George R. Koch, III
(74) *Attorney, Agent, or Firm*—Morrison & Foerster LLP

(57) ABSTRACT

A substrate is held on a spin chuck, and resist solution is supplied to the surface of the substrate at a plurality of positions spaced at predetermined intervals from a plurality of resist nozzles provided the bottom surface of a resist pipe provided over a first direction across the surface of the substrate. Thereafter, the substrate is oscillated or rotated, thereby making the resist solution on the substrate a thin coating film with a uniform thickness. In the coating apparatus and method, which are excellent in responsiveness to a degree of viscosity of coating solution, various kinds of treatment agents with a wide range of viscosity can be used, and mechanical accuracy such as the space between the nozzles and the substrate, accuracy of the nozzle size, and the like can be loosened.

6 Claims, 18 Drawing Sheets

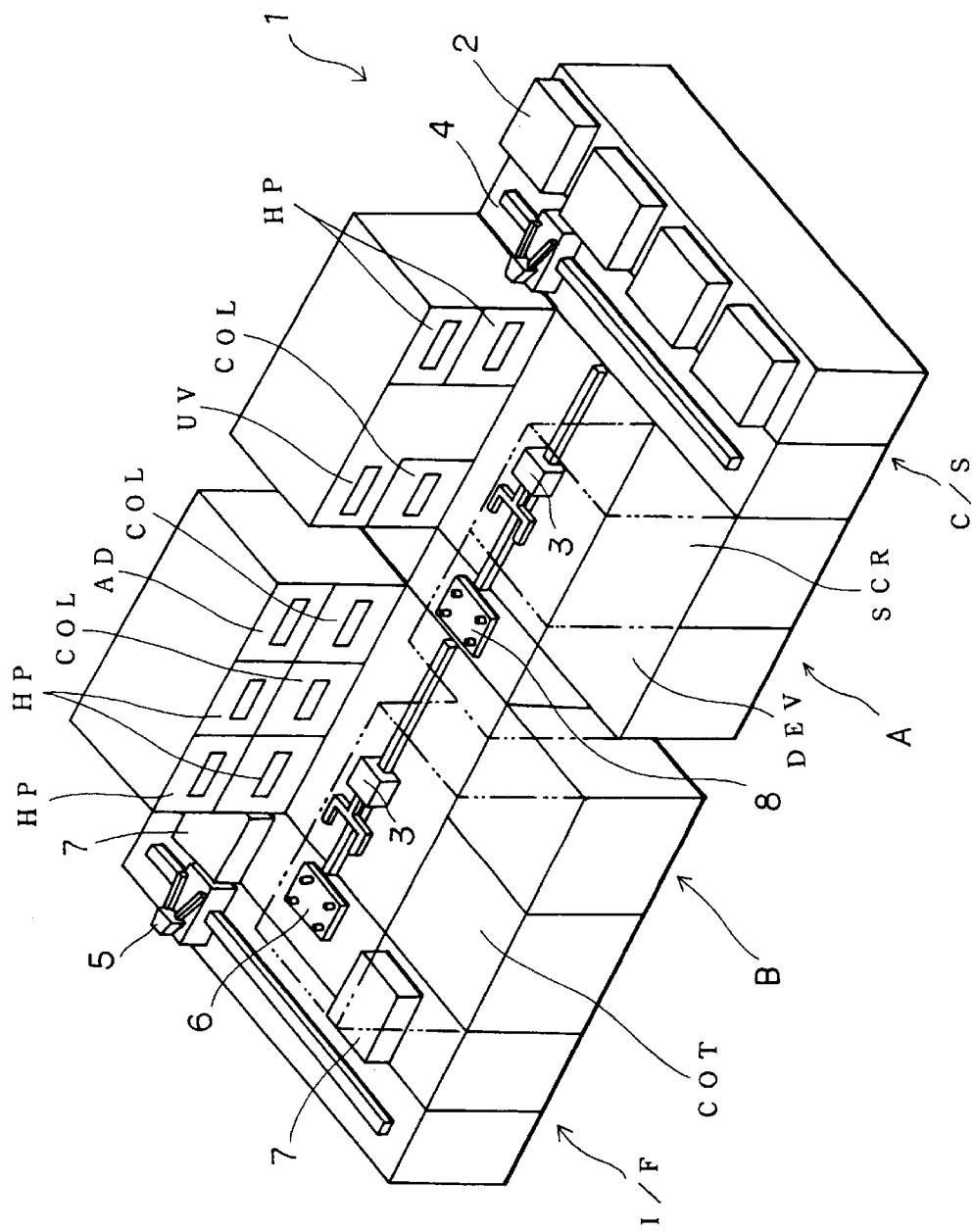
F I G. 1

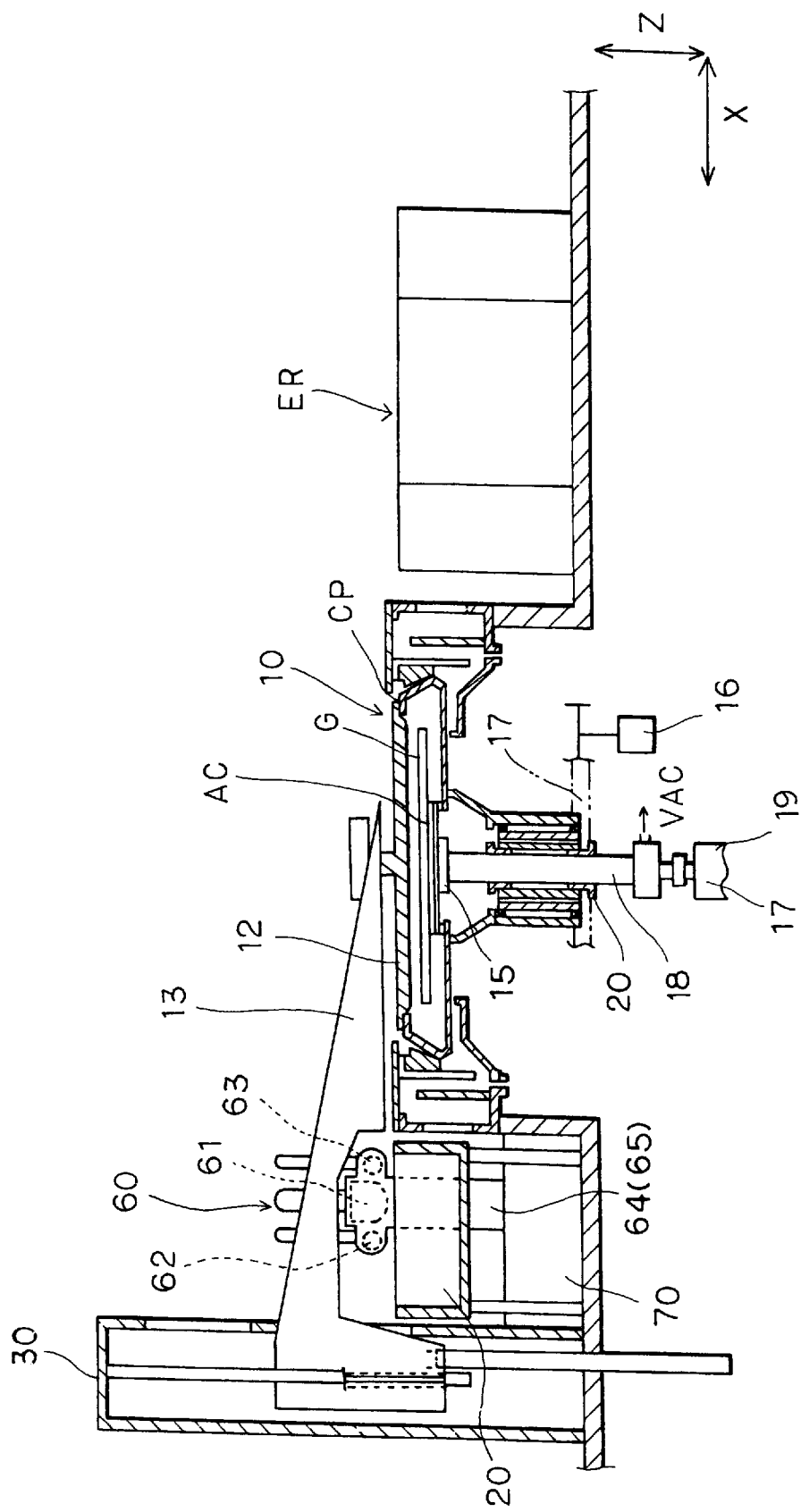
F I G. 4

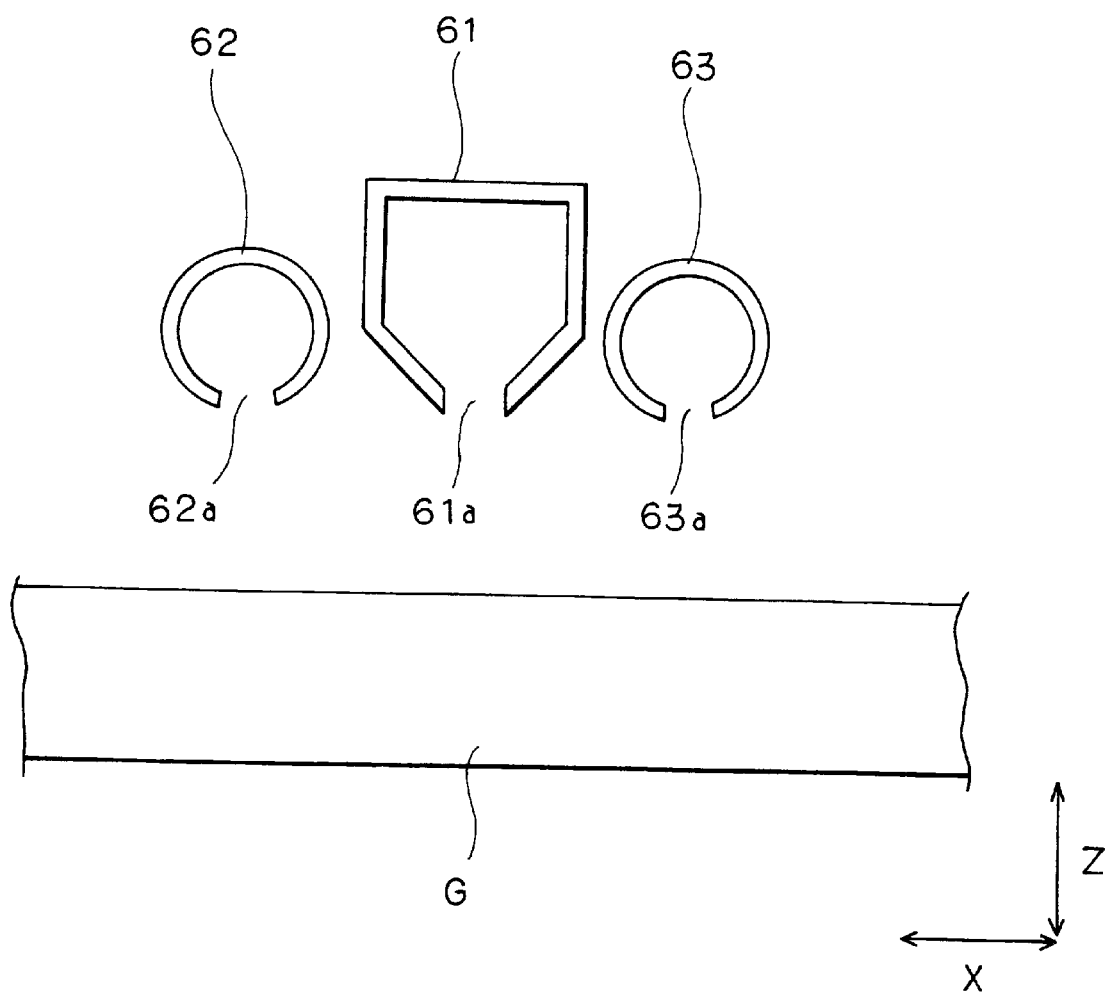
F I G. 6

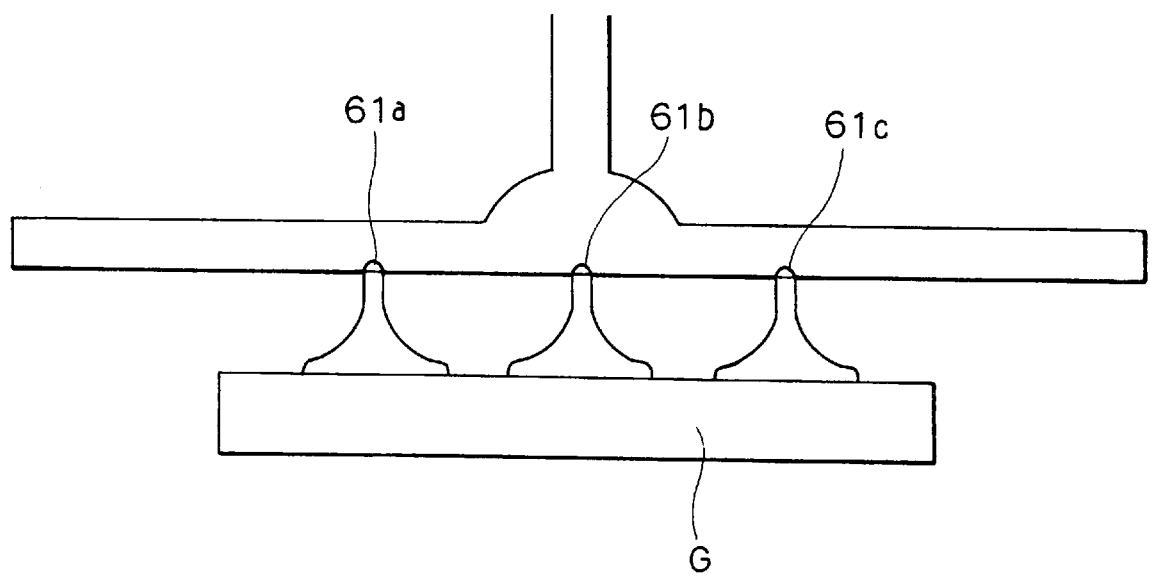
F I G. 10

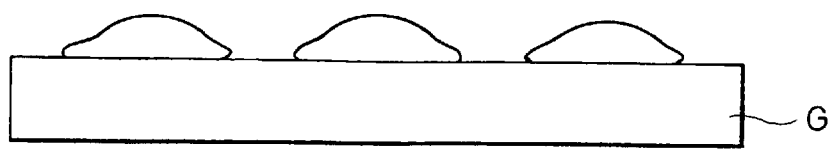
F I G. 1 1
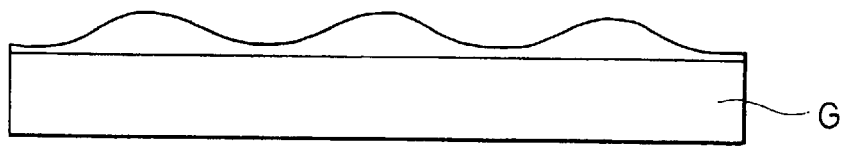
F I G. 1 2
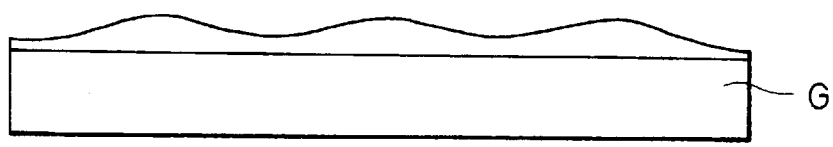
F I G. 1 3
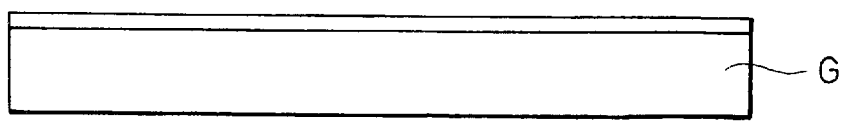
F I G. 1 4

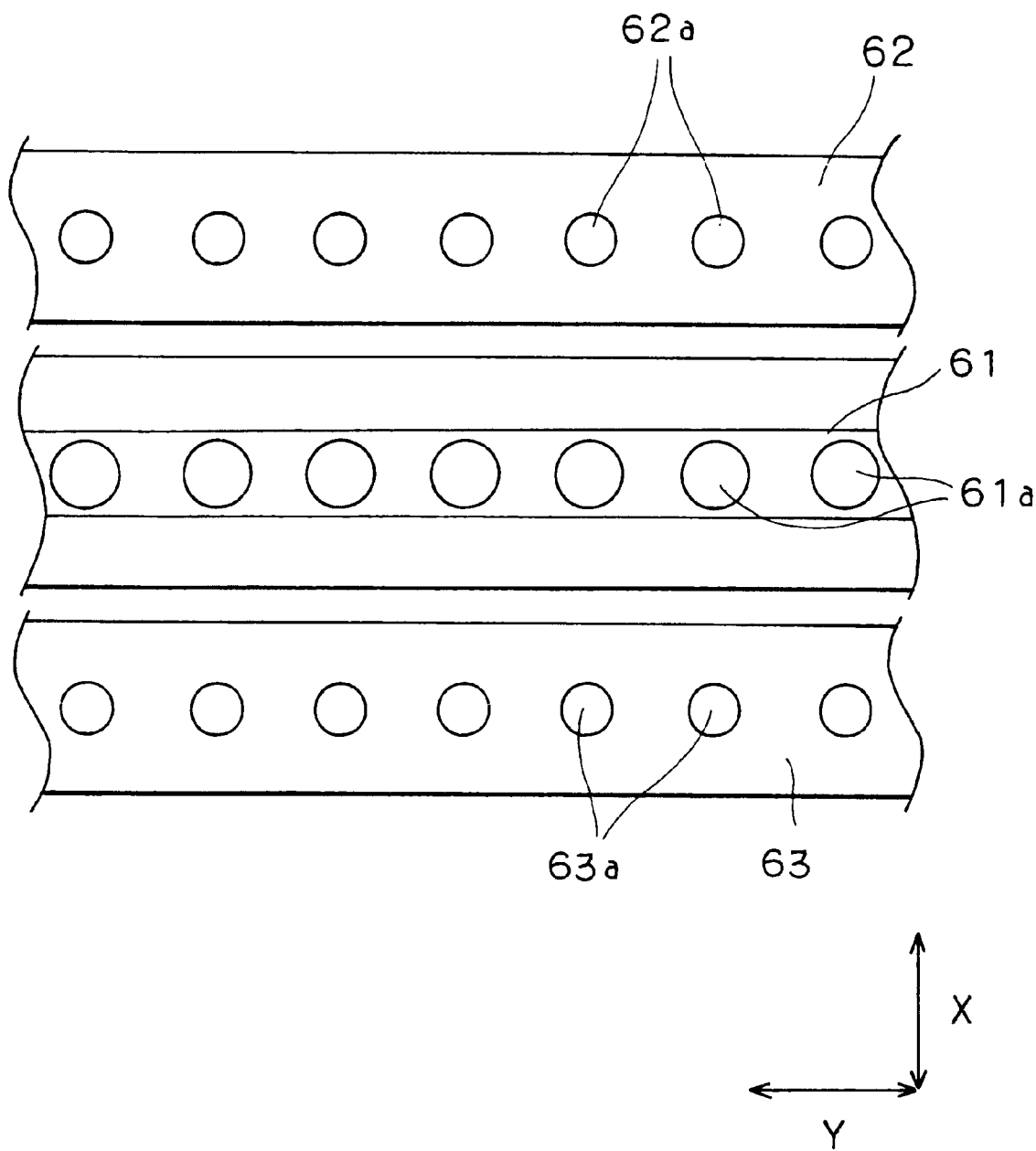
F I G. 21

COATING APPARATUS AND COATING METHOD

FIELD OF THE INVENTION

The present invention relates to a coating apparatus and a coating method for coating a substrate such as a glass substrate for liquid crystal display (LCD) and a semiconductor wafer, for example, with a treatment solution or the like such as a resist solution.

BACKGROUND OF THE INVENTION

Conventionally, a method called "a spin coating method" is generally used for coating a glass substrate for LCD (hereinafter the glass substrate for LCD is simply described as "a glass substrate") with treatment agent such as resist solution. In the spin coating method, a glass substrate is rotated at high speed within a horizontal surface, then a resist solution is dropped in the vicinity of the center of rotation to coat the entire glass substrate therewith by centrifugal force of the glass substrate, and excess resist solution is spun off and eliminated by centrifugal force to make a coating film thinner.

According to the spin coating method, the advantage of enabling coating with a coating apparatus comparatively simple in structure is obtained, but since a resist solution is spread on the entire glass substrate, even a portion with no need for coating is coated with the resist solution, therefore causing the disadvantage of requiring a larger amount of resist solution compared to the area requiring resist coating.

There is a requirement for a thinner resist coating film following an increase in the integration of semiconductor devices formed on a substrate, but in the spin coating method, thickness of the resist coating film is determined according to the viscosity of the resist solution dropped and the rotational speed of the glass substrate, and therefore the thinness of the coating film has limitations.

Consequently, various kinds of proposals have been made to eliminate the disadvantages of the spin coating method.

The prior art, for example, Japanese Patent Application Laid-open No. 4-118073 discloses "a coating apparatus having a slot for discharging coating material on a coating surface of a work piece to be coated, including a slot coater moved relatively to the work piece in a direction perpendicular to the direction in which the slot is extended, and a spin type coating film adjusting mechanism provided at the slot coater and rotating the work piece coated with coating material on the coating surface at high speed while holding it so that the coating surface is almost horizontal".

According to the above method, coating is effectively made with a small amount of coating material.

However, the aforesaid coating apparatus has the following disadvantages.

Specifically, when the space between a slot and a work piece (substrate) varies, the thickness of coating film varies, and the thickness of coating film discharged differs between the center and the end portions of the slot, therefore there is the disadvantage that a highly precise control is needed in order that the space between the slot and substrate is made smaller and constant.

In addition, in the coating apparatus, coating material is discharged in a liquid film state from the slot toward the work piece, therefore it is necessary to use coating material with viscosity high to some extent in order to form the liquid film. A solution with comparatively high viscosity as described above is easy to dry, therefore resulting in the disadvantage of easily causing the slot to clog.

Further, liquid with comparatively high viscosity like the above coating material has a lower content of solvent and the viscosity is easily varied, therefore causing the disadvantage of requiring highly precise control of viscosity.

In addition, in order to make a thin film of coating material with high viscosity discharged on the surface of a work piece and to make the film thickness uniform by rotation, rotation at higher speed is required. However, it is difficult to rotate a LCD with a large screen at high speed, therefore causing the disadvantage that the apparatus is not applicable to a large LCD.

Further, when rotated with coating material with high viscosity, excess coating material is spun off by centrifugal force, and adheres to the inner wall of a rotor cup, but there is the disadvantage that this coating material is difficult to eliminate because of high viscosity.

Furthermore, a large continuous opening is necessary as an opening for forming the slot, therefore causing the disadvantage of a die head increasing in size out of necessity to maintain the strength of dies.

SUMMARY OF THE INVENTION

An object of the present invention is to provide a coating apparatus and coating method which loosen the requirements for mechanical and operational accuracy such as the space between a nozzle and a substrate.

Another object of the present invention is to provide a coating apparatus and method in which treatment agent with low viscosity can be used.

In a first aspect of the present invention, an operation of supplying a treatment agent, and an operation of thin film making of the treatment agent are separately performed, and while the treatment agent is supplied with treatment supplying means, thin film making of the treatment agent is performed with thin film making means. As a result, requirements of mechanical accuracy and operational accuracy for the step of each of the aforementioned operations are relaxed.

Specifically, it is not necessary to control the shapes and the sizes of the nozzles, a space between the treatment agent nozzle and the substrate to be treated, and the like as strictly as in the aforesaid continuous slot.

A treatment agent is supplied onto the surface of the substrate to be treated at a plurality of positions, and therefore a treatment agent with comparatively lower viscosity can be used. Consequently, the treatment agent is difficult to dry with a high content of solvent, therefore making it difficult to clog the nozzles.

Further, the viscosity of the treatment agent has less effect on the film thickness, therefore making it easy to control the viscosity of the treatment agent.

In addition, since a treatment agent with low viscosity can be used, when thin film making is performed by rotating the treatment agent after the coating operation, the coating film can be made thinner at low rpm, therefore making it applicable to a large LCD substrate.

Further, with low viscosity, the treatment agent is easy to remove even if it is attached on the rotor cup.

Furthermore, the treatment agent is supplied separately at a plurality of positions, therefore making it unnecessary to use a treatment agent nozzle including a large opening as a slot, and preventing the treatment agent nozzle increasing in size.

In addition, since thin film making is achieved by being rotated in an enclosed state, airflow is not disturbed, and a coating film with uniform thickness can be obtained.

Further, in another aspect of the present invention, as thin film making means, means for oscillating the treated substrate is employed, therefore enabling thin film making with reliability in a simple construction.

It should be noted that "oscillation" described here includes a vibration in a linear direction with use of an actuator (vibrating element) or the like, and an angular vibration of a spin chuck by normal and reverse rotation in a range of a minute angle in a short cycle. Further, means for rotating the treated substrate is employed as thin film making means, thereby enabling thin film making with reliability in a simple construction.

For example, if the spin chuck is used, a conventional type of apparatus can be used, and it is not necessary to add a new component or element, therefore eliminating a need for new investment in equipment, thus almost eliminating an increase in manufacturing cost.

When using a spin chuck, it is possible to spin off and remove an excess treatment agent by rotating the spin chuck at high speed after making oscillation by an angular vibration within a minute angle after coating the treatment agent.

In still another aspect of the invention, the treatment agents supplied adjacently to one another are supplied at such intervals that the treatment agents integrate with one another on the surface of the treated substrate by the aforesaid thin film making means. As a result, the treatment agents supplied onto the treated substrate are surely integrated, therefore forming a coating film with uniform and smaller thickness much more reliably.

By means for previously supplying solvent onto the surface of the substrate to be treated before a treatment agent is supplied, the surface of the substrate to be treated is previously made wet with solvent by supplying the solvent, thereby increasing comformability of the treatment agent with the substrate to be treated, and quickly spreading the treatment agent, which runs on the surface of the substrate to be treated with the solvent layer between them, therefore surely making the coating film uniform.

In yet another aspect of the invention, a standby position is provided adjacently to the holding member or the spin chuck, and the pressure sensor is placed on the surface of the standby position, opposing the aforesaid treatment agent nozzles to detect the discharge pressure of each treatment agent nozzle. A monitoring section for monitoring the operational condition of each of the aforesaid treatment nozzles based on the detected discharge pressure is provided, and therefore the operational condition of each treatment agent nozzle can be always monitored with the monitoring section, and the treatment agent nozzle clogged is discovered as quickly as possible if any one of the treatment agent nozzles are clogged, which prevents the production from proceeding with a problem occurring to the treatment agent nozzle, therefore slowdown in production is eliminated, and manufacturing efficiency and cost are improved.

An operation of supplying a treatment agent, and an operation of thin film making of the treatment agent are separately performed, and while the treatment agent is supplied with treatment supplying means, thin film making of the treatment agent is performed with thin film making means, therefore relaxing requirements of mechanical accuracy and operational accuracy for the step of each of the aforementioned operations.

A treatment agent is supplied onto the surface of the substrate to be treated at a plurality of positions, and therefore a treatment agent with comparatively lower viscosity can be used. Consequently, the treatment agent is difficult to dry with a high content of solvent, therefore reducing clogging of the nozzles.

Further, the viscosity of the treatment agent has less effect on the film thickness, therefore making it easy to control the viscosity of the treatment agent.

In addition, since a treatment agent with low viscosity can be used, when thin film making is performed by rotating the treatment agent after treatment, the coating film can be made thinner at low rpm, therefore making it applicable to a large LCD substrate.

Further, with low viscosity, the treatment agent is easy to remove even if it is attached on the rotor cup.

Furthermore, the treatment agent is supplied separately at a plurality of positions, therefore making it unnecessary to use a treatment agent nozzle including a large opening as a slot, and preventing the treatment agent nozzle from increasing in size.

In addition, since thin film making is performed by being rotated in an enclosed state, airflow is not disturbed, and a coating film with uniform thickness can be obtained.

BRIEF DESCRIPTION OF THE DRAWINGS

FIG. 1 is a perspective view of a coating/developing apparatus according to a first embodiment of the present invention;

FIG. 4 is a side view of the resist coating unit according to the first embodiment of the present invention;

FIG. 6 is a vertical sectional view of the resist coating unit according to the first embodiment of the present invention;

FIG. 10 is a vertical sectional view of the resist coating unit according to the first embodiment of the present invention;

FIG. 11 is a vertical sectional view of the resist coating unit according to the first embodiment of the present invention;

FIG. 12 is a vertical sectional view of the resist coating unit according to the first embodiment of the present invention;

FIG. 13 is a vertical sectional view of the resist coating unit according to the first embodiment of the present invention;

FIG. 14 is a vertical sectional view of the resist coating unit according to the first embodiment of the present invention;

FIG. 21 is a view of a coating solution supplying device seen from below according to another embodiment of the present invention.

DETAILED DESCRIPTION OF THE PREFERRED EMBODIMENTS

Preferred embodiments of the present invention will be explained below based on an example applied to a cleaning apparatus used in a resist treatment system for forming photo resist on a surface of a glass substrate G (hereinafter called "a substrate G"). It is not limited to a glass substrate, but applicable to a substrate in a plane body such as a semiconductor wafer for a liquid crystal display (LCD).

Detailed embodiments of the present invention will be explained below with reference to the drawings.

Figure 2:
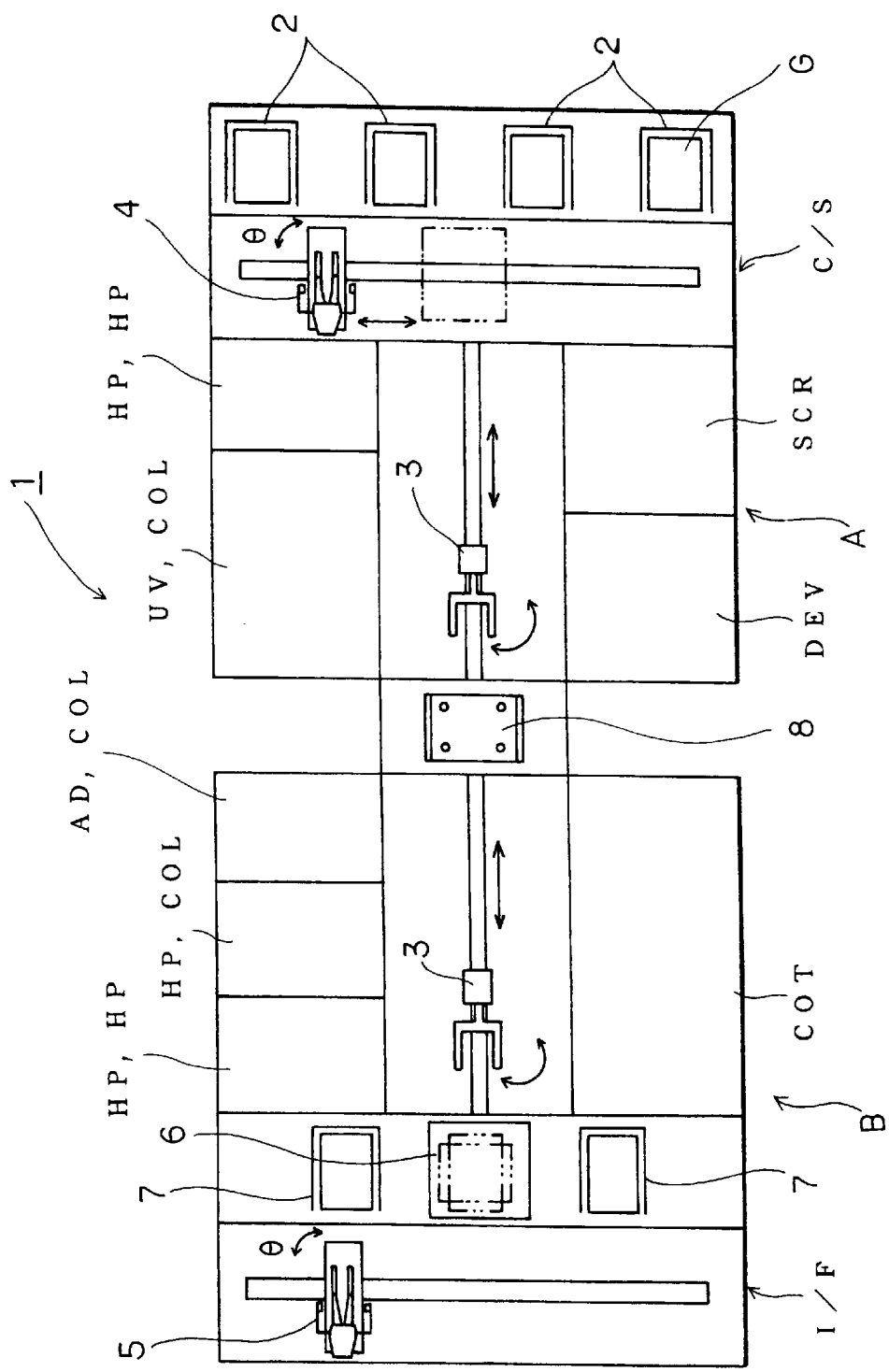
FIG. 2 is a plan view of the coating/developing apparatus according to the first embodiment of the present invention.

FIG. 1 is a perspective view of a coating/developing apparatus according to an embodiment of the present invention, and FIG. 2 is a plan view thereof.

A coating/developing apparatus 1 includes a cassette station C/S at one end thereof. At the other end of the coating/developing apparatus 1, an interface unit I/F is disposed for passing a glass substrate G for a LCD (the glass substrate for a LCD is abbreviated as "a substrate" hereinafter) from/to an aligner (not shown).

A plurality of, for example, four pairs of cassettes 2 accommodating the substrates G such as LCD substrates are placed on the cassette station C/S. At the front of the cassettes 2 of the cassette station C/S provided is an auxiliary arm 4 for carrying and positioning the substrate G to be treated, and for holding the substrate G while passing it from/to a main arm 3.

An auxiliary arm 5 for passing the substrate to/from the aligner (not shown) is provided at the interface unit I/F. Further, at the interface unit I/F, provided are an extension section 6 for passing the substrate G to/from the main arm 3, and a buffer unit 7 for keeping the substrate G on standby at present.

Two of the main arms 3 are placed in series to be movable in a longitudinal direction in the middle of the coating/developing apparatus 1, and a first processing unit group A and a second processing unit group B are respectively disposed on both sides of the carrier passage of the respective main arms 3. A relay section 8 for holding and cooling the substrate G at the present is disposed between the first processing unit A and the second processing unit B.

In the first processing unit group A, a cleaning processing unit SCR for cleaning the substrate G and a development processing unit DEV for performing development processing are placed in parallel alongside the cassette station C/S. At the opposite side of the cleaning processing unit SCR and the development processing unit DEV across the carrier passage of the main arm 3, two pairs of heat treatment units HP vertically disposed in two tiers, and a UV treatment unit UV and a cooling unit COL vertically disposed in two tiers are placed side by side.

In the second processing unit group B, a coating treatment unit COT for performing resist coating treatment and edge remove treatment is placed. At the opposite side of the coating treatment unit COT across the carrier passage of the main arm 3, an adhesion unit AD for applying hydrophobia treatment to the substrate G and the cooling unit COL vertically disposed in two tiers, the heat treatment unit HP and the cooling unit COL vertically disposed in two tiers, and two pairs of heat treatment units HP vertically disposed in two tiers are placed side by side. When the heat treatment unit HP and the cooling unit COL are vertically disposed in two tiers, the heat treatment unit HP is disposed on the cooling unit COL, thereby avoiding thermal interference from each other. As a result, more accurate temperature control can be achieved.

The main arm 3 includes an X axis driving mechanism, a Y axis driving mechanism, and a Z axis driving mechanism, and further a rotary driving mechanism rotating around the Z axis. The main arm 3 appropriately travels along the central passage of the coating/developing apparatus 1 to carry the substrate G between respective processing units. The main arm 3 carries the substrate G to be treated into each processing unit, and carries the treated substrate G out of each processing unit.

In the coating/developing apparatus 1 in the embodiment, respective processing units are brought together and integrated as described above, thereby saving the space and increasing the processing efficiency.

In the coating/developing apparatus 1 configured as above, at first, the substrate G in the cassette 2 is carried to the cleaning processing unit SCR via the auxiliary arm 4 and the main arm 3 to be subjected to cleaning processing.

Next, the substrate G is carried to the adhesion unit AD via the main arm 3, the relay section 8 and the main arm 3 to be subjected to hydrophobia treatment. Thereby the fixedness of resist can be increased.

Subsequently, the substrate G is carried to the cooling unit COL via the main arm 3 to be cooled.

Thereafter, the substrate G is carried to the coating treatment unit COT via the main arm 3 to be coated with resist.

Next, the substrate G is carried to the heating treatment unit HP via the main arm 3 to be subjected to pre-baking processing. After the substrate G is carried to the cooling unit COL via the main arm 3 and cooled, it is carried to the aligner via the main arm 3 and the interface unit I/F, where a predetermined pattern is exposed.

The substrate G exposed again is carried into the apparatus 1 via the interface unit I/F, and carried to the heating treatment unit HP via the main arm 3, where post exposure-baking processing is performed.

Thereafter, the substrate G is carried to the cooling unit COL via the main arm 3, the relay section 8, and the main arm 3 to be cooled. The substrate G is carried to the development processing unit DEV via the main arm 3 to be subjected to the development processing, whereby forming the predetermined circuit pattern. The substrate G which is given the development processing is carried to the post-baking processing unit HP via the main arm 3 to be subjected to the post-baking processing.

The substrate G given the post-baking processing is housed in the predetermined cassette 2 on the cassette station C/S via the main arm 3 and the auxiliary arm 4.

Figure 3:
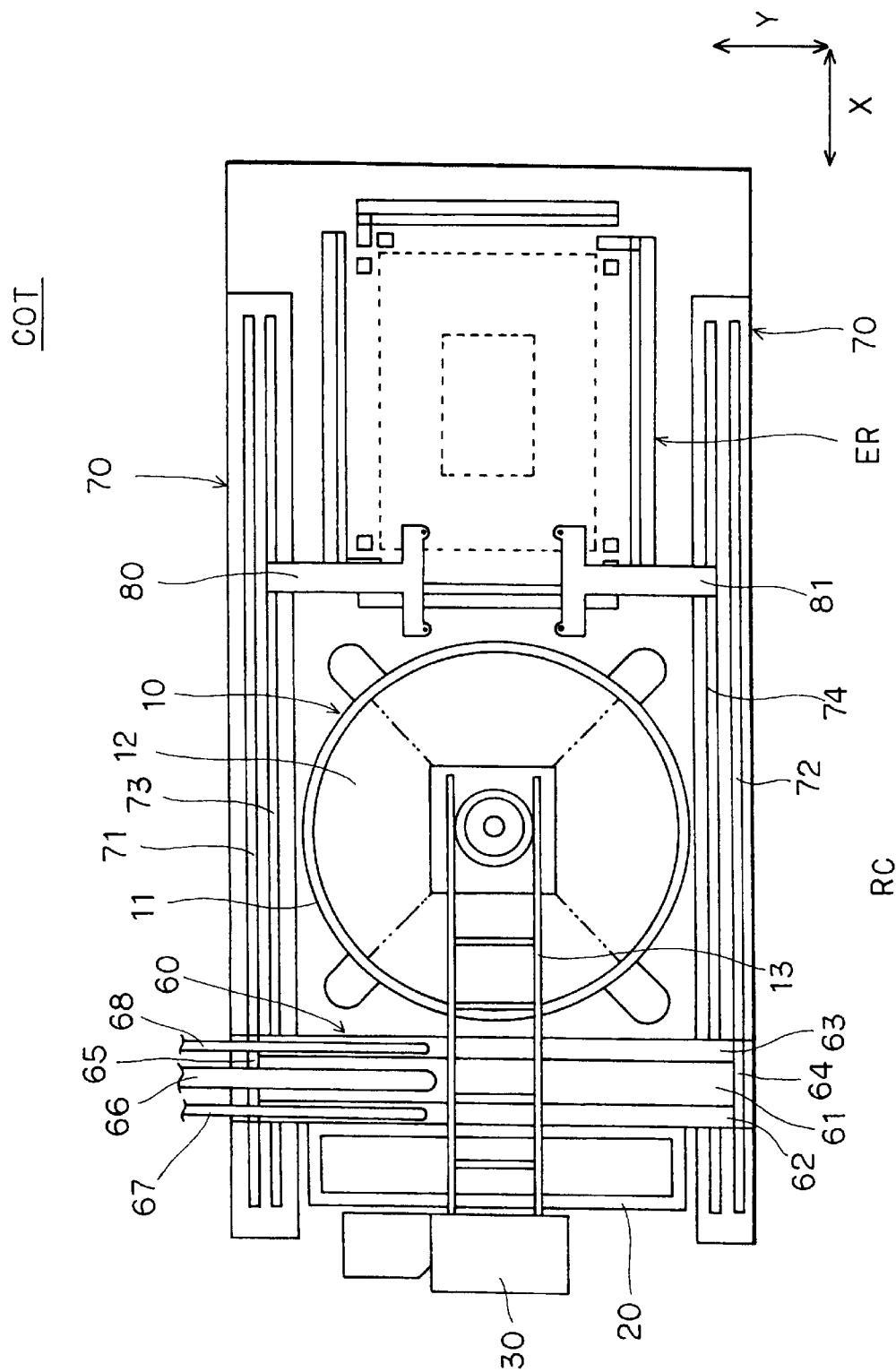
FIG. 3 is a plan view of a resist coating unit according to the first embodiment of the present invention.
Figure 5:
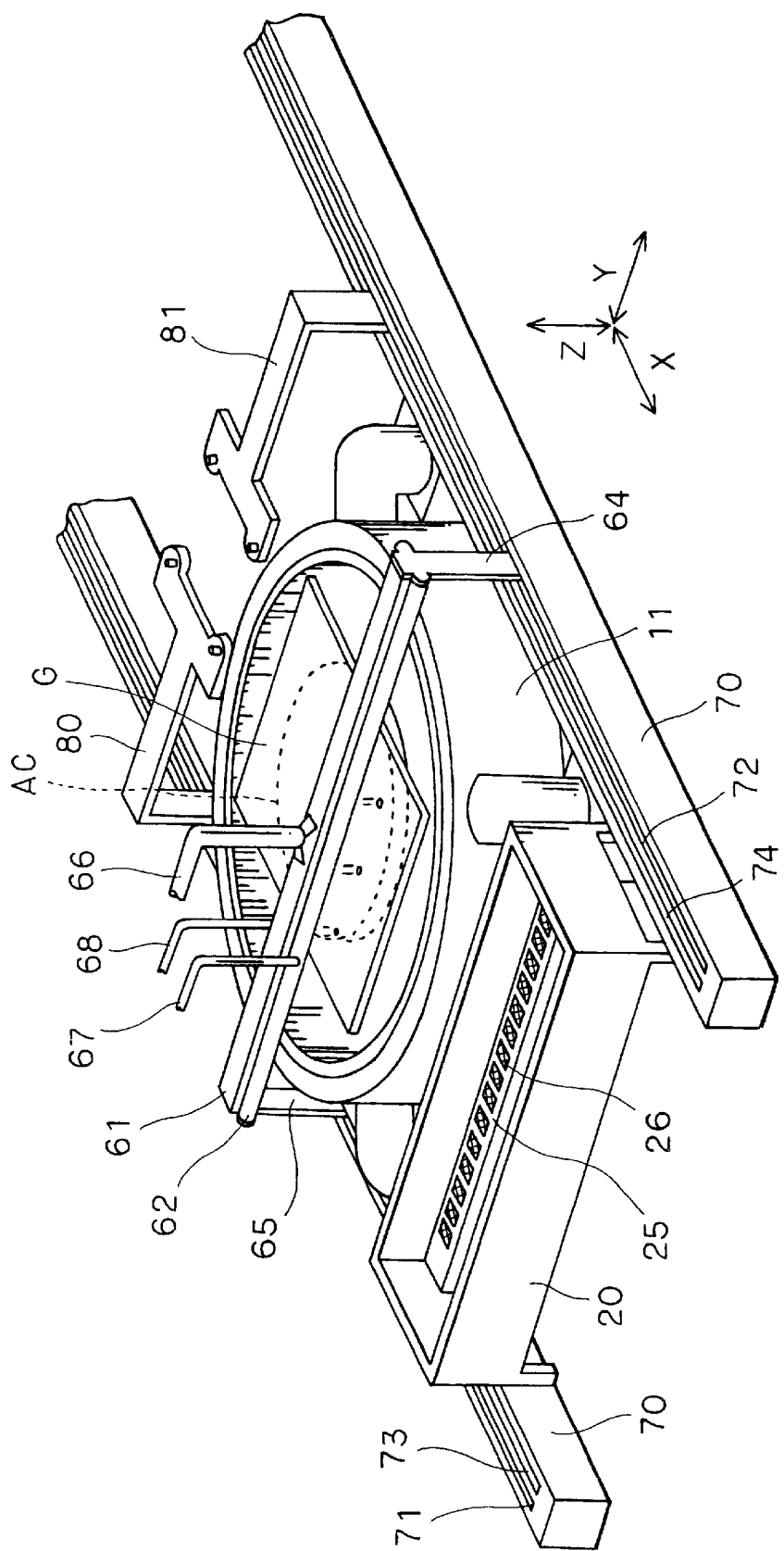
FIG. 5 is a perspective view of the resist coating unit according to the first embodiment of the present invention.

Next, the coating treatment unit (COT) according to the embodiment will be explained. FIG. 3 is a plan view of the coating treatment unit (COT) according to the embodiment, FIG. 4 is a side view, and FIG. 5 is a perspective view.

As shown in FIG. 3, a resist coating section RC and an edge remover ER are disposed to adjoin to each other in the coating treatment unit (COT). Of the two, the resist coating section RC is for coating the surface of the substrate G given a processing of the previous step such as cleaning processing and pre-baking, with treatment such as resist solution. The edge remover ER is for peeling off and removing the resist coating film on the outer perimeter edge portion (edge) requiring no resist coating in the substrate G of which surface the resist coating film is formed at the resist coating section RC.

When the coating film is selectively formed only on a portion requiring resist coating, on the surface of the substrate G, the edge remover is not necessarily required and can be omitted.

The resist coating section RC is composed by a rotor cup 10 serving as a substrate holding device for rotatably holding the substrate G as a substrate to be treated, a coating solution supplying device 60 for supplying resist solution and solvent to the top surface of the substrate G held by the rotor cup 10, and a moving device 70 for moving the coating solution supplying device 60 relative to the rotor cup 10.

The appearance of the rotor cup 10 is defined by a side wall portion 11 in a cylindrical pipe form including an axis in a vertical direction, and a lid 12 blocking the upper end surface of the side wall portion 11, and a hoisting and lowering arm 13 is attached at the lid 12 to be attachable and detachable.

FIG. 3 is a plan view showing a state that the lid 12 of the coating treatment unit (COT) is closed, and FIG. 4 is a vertical sectional view of the coating treatment unit (COT).

A spin chuck 15 for rotatably holding the substrate G and a rotary driving mechanism for rotating the spin chuck 15 are placed in a space inside the rotor cup 10.

A ring-shaped cup CP is disposed inside the rotor cup 10, and inside thereof, the spin chuck 15 is disposed. The spin chuck 15 is constructed so as to be rotated by the rotary driving force of a driving motor 16 while fixedly holding the substrate G by vacuum suction.

Further, an actuator (a vibrating element) AC for vibrating the substrate G is placed on the top surface of the spin chuck 15, which abuts to the substrate G. The actuator AC is a vibrating element vibrating when voltage is applied thereto, and applied voltage is controlled via a control section 100 described below, which vibrates the actuator AC to thereby oscillate the substrate G held on the top surface of the spin chuck 15.

The driving motor 16 transmits rotary driving force to a rotating shaft 18 via a gear train 17, and the rotating shaft 18 is attached movably along hoisting and lowering guide means 20 in the vertical direction in the drawing by a hoisting and lowering drive means 19.

When performing resist coating, as shown in FIG. 4, the spin chuck 15 descends up to a position lower than the upper end of the cup CP. On the other hand, when the substrate G is passed between the spin chuck 15 and the main arm 4, at which the substrate G is put into or taken out of the rotor cup 10, the hoisting and lowering drive means 19 lifts the rotating shaft 18 and the spin chuck 15 upwards, and thereby the spin chuck 15 is displaced up to a position higher than the upper end of the cup CP.

Meanwhile, the coating solution supplying device 60 discharging resist solution on the substrate G set on the aforesaid spin chuck 15 is placed to be across the rotor cup 10 in the Y direction.

The coating solution supplying device 60 is composed by a resist pipe 61 placed to be parallel with the upper end surface of the rotor cup 10 and across the top surface of the substrate G in the Y direction, and leg members 64 and 65 blocking both end portions of the resist pipe 61 and supporting the resist pipe 61. The leg members 64 and 65 are engaged with guide rails 71 and 72 of the moving device 70 described below.

The moving devices 70 and 70 are box-shaped elongated members, and each of them is placed to each side of the rotor cup 10 in the Y direction and is placed extensively at the location of the edge remover ER from the location of the rotor cup 10 along the X direction. Two elongated grooves are provided on the top surface of the moving device 70 along the X direction.

These grooves are the guide rails 71 and 72 in which the leg members 64 and 65 of the coating solution supplying device 60 are engaged, and guide rails 73 and 74 in which carrying members 80 and 81 are engaged.

Inside the moving devices 70 and 70, known moving mechanisms (omitted in the drawings), such as belt driving mechanisms transmitting driving force of a driving motor with an endless belt, are placed, thereby transmitting the driving force of the driving motor so as to independently move the leg members 64 and 65 and the carrying members 80 and 81 in the X direction.

As shown in FIG. 3, a solvent pipe 62 and a gas pipe 63 are respectively placed at both sides of the resist pipe 61 in the X direction. These resist pipe 61, solvent pipe 62, gas pipe 63 have a structure in a hollow tube form. A plurality of opened portions are provided on the bottom surfaces, that is, the surfaces opposing the substrate G held on the spin chuck 15, at predetermined intervals in the Y direction, and respectively form resist nozzles 61a, 61b, and 61c, solvent nozzles 62a, 62a ..., and gas nozzles 63a, 63a .... These resist pipe 61, solvent pipe 62, and gas pipe 63 are respectively provided with a resist supply pipe 66, a solvent supply pipe 67, and a gas supply pipe 68, which are respectively connected to a resist supply system, a solvent supply system, and gas supply system not shown, to thereby supply resist solution, solvent, gas including evaporated solvent respectively to the resist pipe 61, solvent pipe 62, and gas pipe 63.

Figure 7:
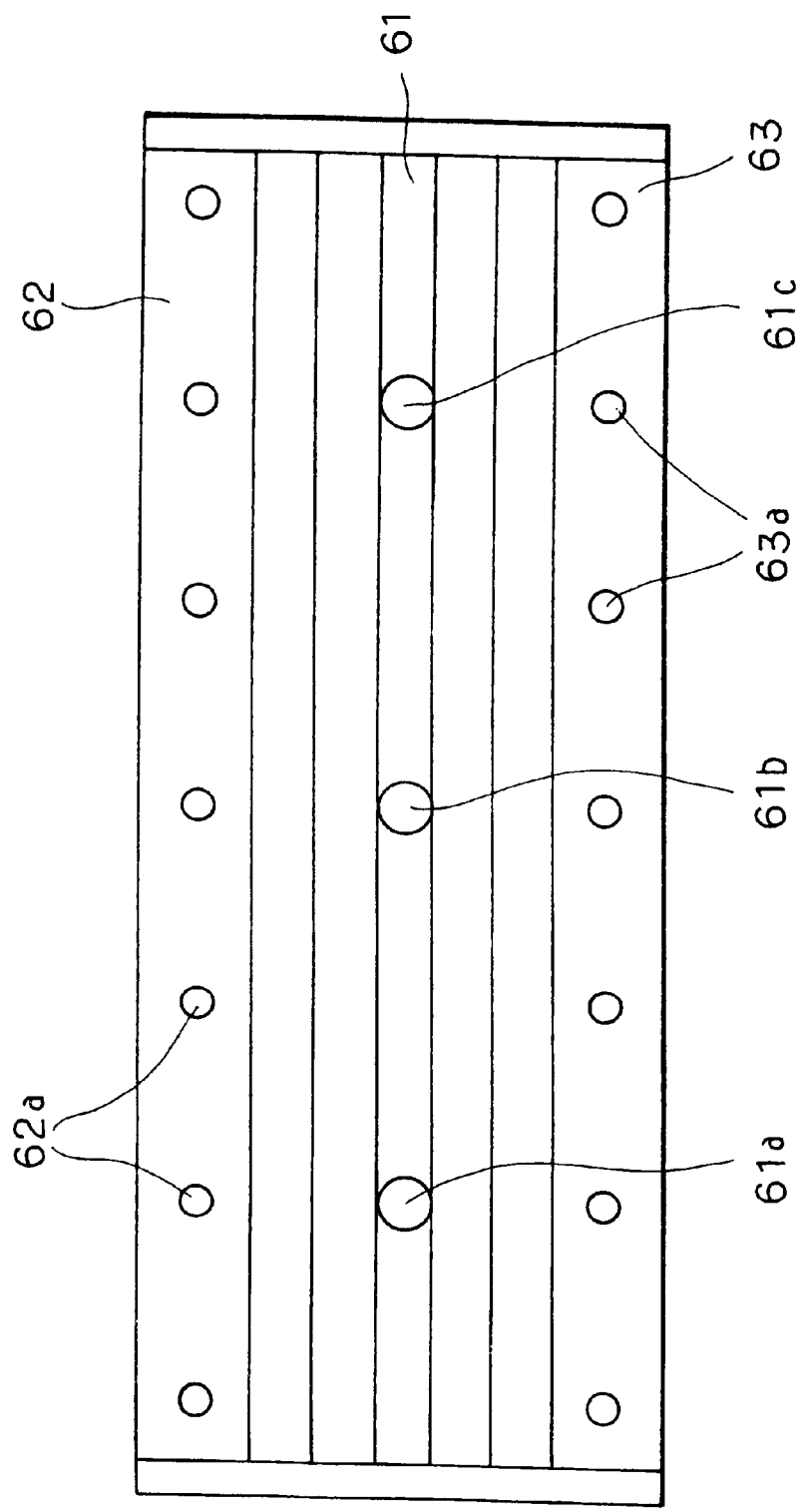
FIG. 7 is a view of a coating solution supplying device according to the first embodiment of the present invention, which is seen from below.

FIG. 6 is a partially enlarged view of a vertical sectional view of the substrate G and the coating solution supplying device 60, and FIG. 7 is a view of the resist pipe 61, the solvent pipe 62, and the gas pipe 63, seen from below.

As shown in FIG. 6, the resist pipe 61 includes a sectional form of a trapezoid or a deformed hexagon formed by narrowing the lower portion of a square pipe, for example, and a plurality of the aforesaid resists nozzles, for example, the three resist nozzles 61a, 61b, and 61c are provided on the surface opposing the substrate G in the Y direction at predetermined intervals. The intervals between the resist nozzles 61a and 61b, and between 61b and 61c in the Y direction are such intervals as allow treatment agents supplied adjacently to join to each other and integrate on the substrate to be treated when the treatment agents respectively supplied from the adjacent resist nozzles, specifically, from 61a and 61b, and 61b and 61c, are supplied onto the substrate G. The specific value of the interval is a matter of design, and is determined according to the relationship among respective parameters of viscosity of a treatment agent, the size of the resist nozzles 61a to 61c, the space between the resist nozzles 61a to 61c and the substrate G, resist supplying speed, and the like.

Both of the solvent pipe 62 and the gas pipe 63 are round shaped pipes. A plurality of opened portions are formed on the bottom surface thereof as in the resist pipe 61 to compose a plurality of the solvent nozzles 62a, 62a . . . , and the gas nozzles 63a, 63a . . . .

In the rotor cup 10, the opening on the top of the rotor cup body 10 is designed to be covered with the lid 12, which is held by the hoisting and lowering arm 13 to be detachable and attachable.

As shown in FIGS. 3 and 4, the hoisting and lowering arm 13 is composed of two arms 13a and 13b holding the lid 12 between them at the foremost ends thereof, and a coupling member 14 placed between these two arms 13a and 13b and coupling these two arms 13a and 13b.

The bottom side of the hoisting and lowering arm 13, specifically, the opposite side to the one holding the lid 12 extends into a cup lifter 30, and the hoisting and lowering arm 13 is designed to hoist and lower the lid 12 by means of a lid hoisting and lowering mechanism incorporated in the cup lifter 30. For convenience of explanation, the hoisting and lowering arm 13 and the cup lifter 30 are omitted in FIG. 5.

A cleaning bath 20 for cleaning the resist nozzle 61a is provided between the aforesaid rotor cup 10 and the aforesaid cup lifter 30. The cleaning bath 20 will be described below.

Figure 8:
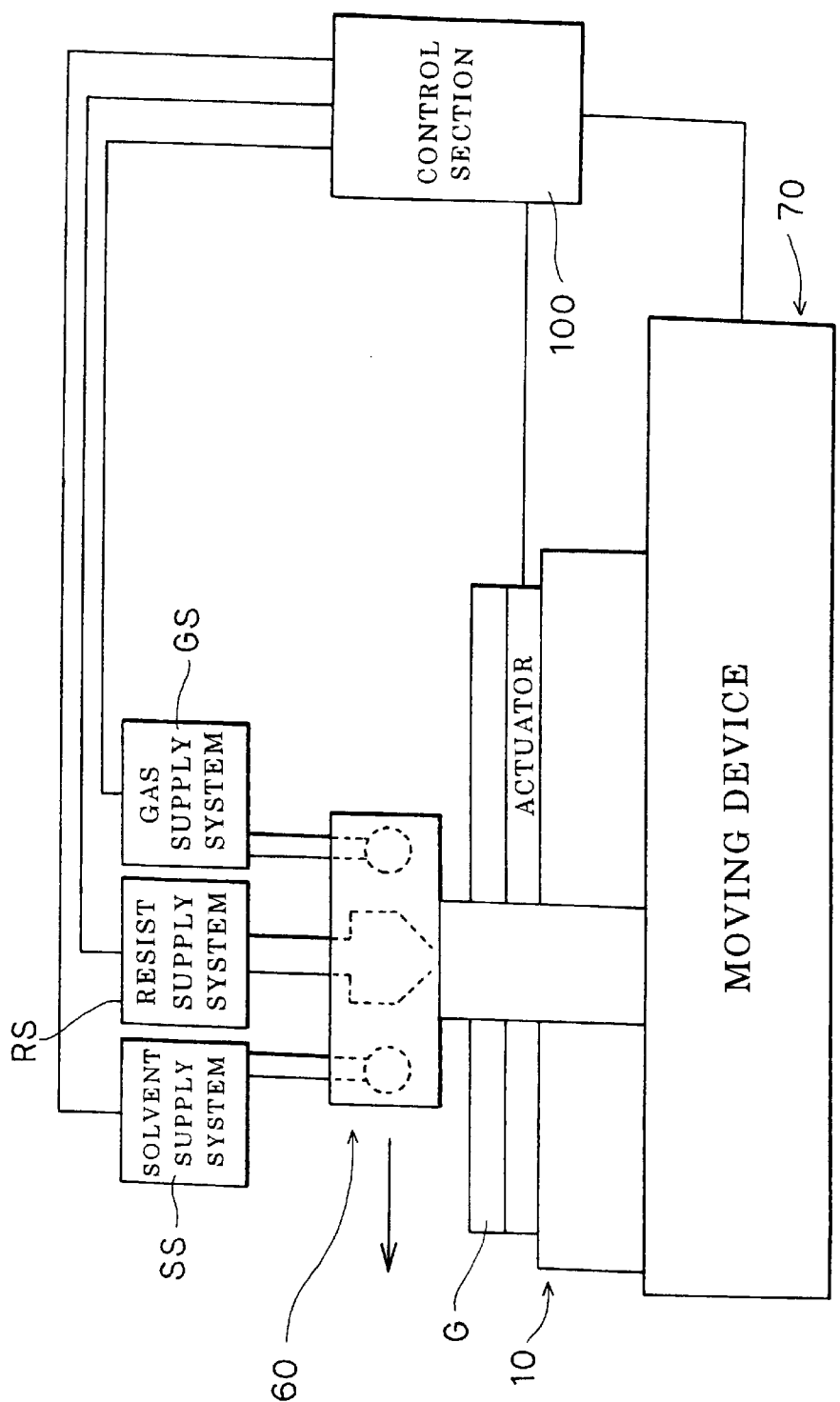
FIG. 8 is a block diagram of the resist coating unit according to the first embodiment of the present invention.

FIG. 8 is a block diagram showing a control system of the coating treatment unit (COT) according to the embodiment.

As shown in FIG. 8, the rotor cup 10, the actuator AC, the coating solution supplying device 60, the moving device 70 for moving the coating solution supplying device 60, the resist solution supply system RS for supplying resist solution to the coating solution supplying device 60, the gas supply system GS for supplying gas to the coating solution supplying device 60, and the solvent supply system SS for supplying solvent to the coating solution supplying device 60 are connected to the control section 100, by which general control is performed.

The operation of the coating treatment unit (COT) according to the embodiment will be explained below.

In the coating treatment unit (COT), a resist coating film is formed on the substrate G by two separate operations, that is, supplying operation of resist solution, and spreading operation of the supplied resist solution.

The supplying operation of the resist solution onto the substrate G is performed by discharging resist solution almost vertically to the surface of the substrate G from the resist nozzles 61a to 61c while moving the rotor cup 10 and the coating solution supplying device 60 relatively to each other. In this operation, it is suitable if only the resist solution is supplied onto the surface of the substrate G, and it is not necessarily required that the entire substrate surface is covered.

Figure 9:
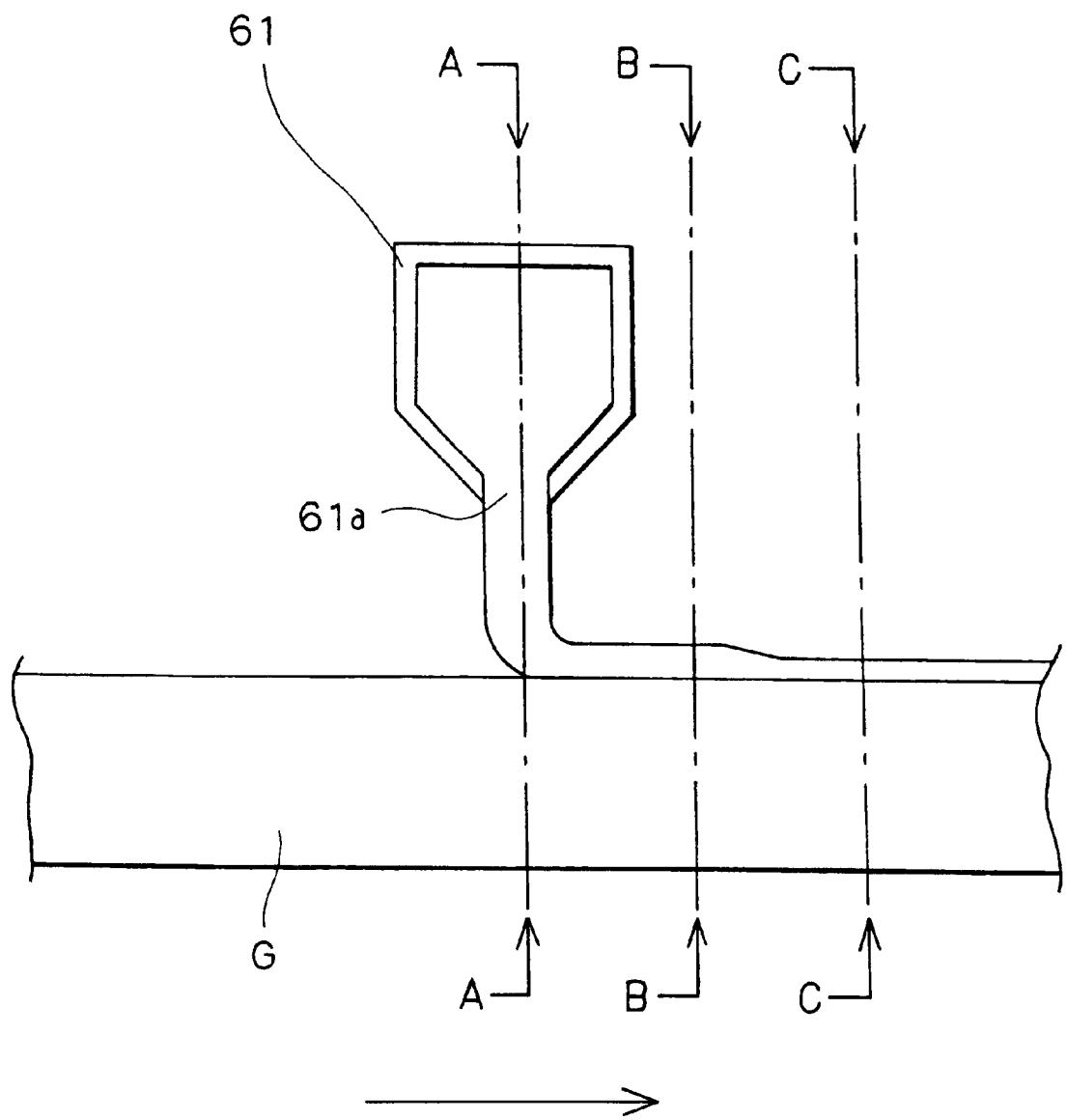
FIG. 9 is a vertical sectional view of a resist pipe according to the first embodiment of the present invention.

FIG. 9 is a vertical sectional view in the Y direction schematically showing a situation in which resist solution is continuously supplied to the substrate G from the resist pipe 61.

As shown in FIG. 9, the moving device 30 is operated to move the coating solution supplying device 60 and the rotor cup 10 in the opposite direction to each other, thereby moving the substrate G in the arrow direction in FIG. 9 relatively to the resist nozzles 61a to 61c.

In this situation, resist solution is supplied from the resist nozzles 61a to 61c.

In this embodiment, resist solution is continuously supplied. FIG. 10 is a sectional view taken along the A—A line in FIG. 9, seen from the X direction, FIG. 11 is a sectional view of the situation in FIG. 9 taken along the B—B line seen from the X direction, and FIG. 12 is a sectional view of the situation in FIG. 9 taken along the C—C line in X direction.

As shown in FIGS. 9 and 10, when the viscosity of the resist solution is suitable, the resist solution continuously flows to the surface of the substrate G from each of the resist nozzles 61a to 61c of the resist pipe 61.

In this situation, as shown in FIG. 10, the resist solution supplied onto the surface of the substrate G rises at a portion just below each of the resist nozzles 61a to 61c, whereby forming three mounds of the resist solution spaced from one another. In the portion between these mounds, where the resist solution is not directly supplied, the surface of the substrate G is exposed.

As shown in FIG. 11, in the sectional view taken along the B—B line, the surfaces of the resist solution become round because of the surface tension of the resist solution and the gravity. The space between the adjacent mounds of the resist solution is somewhat narrowed, but the mounds do not join to be integrated yet, and the surface of the substrate G still remains exposed.

Next, an oscillating operation is performed to spread the supplied resist solution.

In the coating treatment unit according to the embodiment, an oscillating operation is performed by operating the actuator AC placed on the surface of the spin chuck 14 and contacting the bottom surface of the substrate G in the drawing.

As described above, when voltage is applied to the actuator AC with the resist solution in a form of three separate mounds being laid on the surface of the substrate G as shown in FIG. 11, the actuator AC causes vibrations, thereby oscillating the substrate G abutted to the actuator AC, and the resist solution laid thereon. The oscillation causes the aforesaid resist solution to increase in fluidity, and to decrease in the height in the Z direction and spread in a horizontal direction. In this situation, as described above, an interval at which the resist solution is supplied on the substrate G is such an interval as allows the resist solutions to integrate with each other on the surface of the substrate G by means of thin film making means such as an actuator.

Therefore, when oscillated by the vibrations from the actuator AC, the adjacent mounds of the resist solution joins to each other at their ends. At the same time, the exposed portions on the substrate G disappear, and the entire surface of the substrate G is covered with the resist solution. The situation is shown in FIG. 12. In this step, however, the entire surface of the resist solution becomes wavy, and the film thickness is still large with inadequate uniformity.

When the oscillation is further continued, the film thickness in a horizontal direction is made uniform. FIGS. 13 and 14 show the situation in which the film thickness is uniformly made thinner.

As shown in FIGS. 13 and 14, with the passage of time, the uniformity of the film thickness increases, and the film thickness is made uniform across the entire area in a horizontal direction.

Concurrent use of the solvent pipe 62 and the gas pipe 63, which are not used in this embodiment, enables thin film making with proper uniformity in a shorter time.

Figure 15:
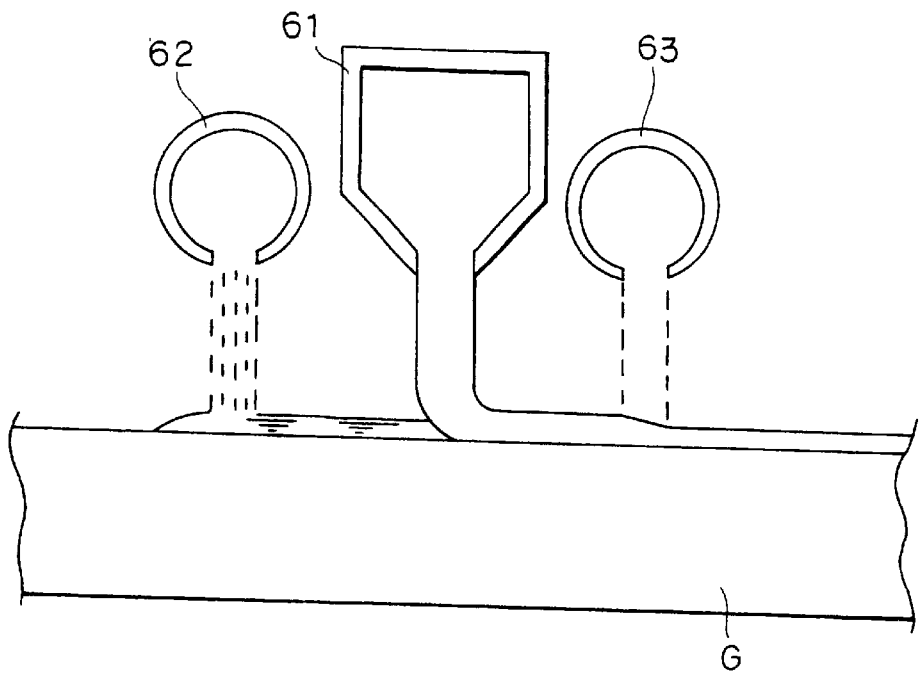
FIG. 15 is a vertical sectional view of the resist coating unit according to the first embodiment of the present invention.

FIG. 15 is a vertical sectional view schematically showing the situation in which a gas pipe 63 and a solvent pipe 62 are operated.

Specifically, when the substrate G becomes wet as a result of solvent being supplied from the solvent pipe 62 onto the surface of the substrate G before resist coating, the solvent has lower surface tension, therefore spreading widely on the substrate G to form a solvent layer with small thickness on the substrate. The solvent layer increase conformability of the resist solution to be subsequently supplied and the substrate G. When the resist solution is subsequently supplied onto the solvent layer from the resist pipe 61, the resist solution rapidly spreads along the surface of the aforesaid solvent layer over the entire solvent layer.

Consequently, the resist solution discharged onto the substrate G from the resist nozzles 61a to 61c easily spreads over the surface of the substrate G in a very short time after being discharged.

As a result, the resist solution in this state easily spreads over the substrate G when oscillated by the thin film making means such as the actuator 15, and the adjacent resist solutions join to each other to be integrated, whereby forming a thin resist coating film with uniform thickness.

Meanwhile, when a gas including evaporated solvent is injected from the gas pipe 63, pressure acts on the surface of the resist solution supplied onto the substrate G, thereby spreading the resist solution over the surface of the substrate G. Consequently, thin coating film with uniformity is formed more easily and quickly.

In this case, it is effective to spread the resist solution by blowing gas onto the portions at which the aforesaid corrugated mounds of the resist coating film are formed, and therefore the opening of the gas pipe 63 is preferably placed at the same position as the opening of the resist pipe 61 with respect to a cross direction of the substrate G (the Y direction). The solvent and the gas supplied from the solvent pipe 62 and the gas pipe 63 may be previously heated to lower the viscosity of the resist solution with the heat.

Further, it is possible that a heater such as a nichrome wire, for example, is incorporated into the spin chuck 15 holding the substrate G, and that the substrate G is heated by the heater to lower the viscosity when the resist solution is supplied onto the substrate G, which is, however, omitted in the embodiment. In this case, it is preferable to use the next larger size square spin chuck than the substrate G in order to uniformly heat the square substrate G and then to provide the heater so that the entire spin chuck is uniformly heated.

As described above, in the coating treatment unit according to the present embodiment, the operations of supplying the resist solution and making the supplied resist coating film thinner are separately performed, and actual thin film making is performed after the resist solution is supplied onto the substrate G.

Consequently, it is suitable if only the resist solution discharged from the resist nozzles 61a to 61c is supplied onto the surface of the substrate G, and an operation such as processing is not performed in the space from the resist nozzles 61a to 61c to the substrate G, therefore the mechanical accuracy of the resist nozzles 61a to 61c such as the shapes and the diameters of the nozzles, and the control accuracy such as a discharge quantity and a discharge speed are not strictly required.

In addition, even if a number of nozzles with small diameters are opened, a smaller degree of the strength of the nozzle pipe 61 is lost, and therefore the nozzle pipe 61 is deformed less with the size accuracy of the resist nozzles 61a to 61c being easily secured.

Further, the resist solution with lower viscosity can be used, therefore making it difficult to cause the disadvantage of the nozzle drying.

It should be noted that the present invention is not limited to the embodiments described in the specification.

For example, in this embodiment, as the resist nozzles 61a to 61c, the square resist pipe 61 with three openings provided in the bottom is used, but it is suitable to use a line of independent members in a slim mouth piece form with a piping being connected.

Figure 16:
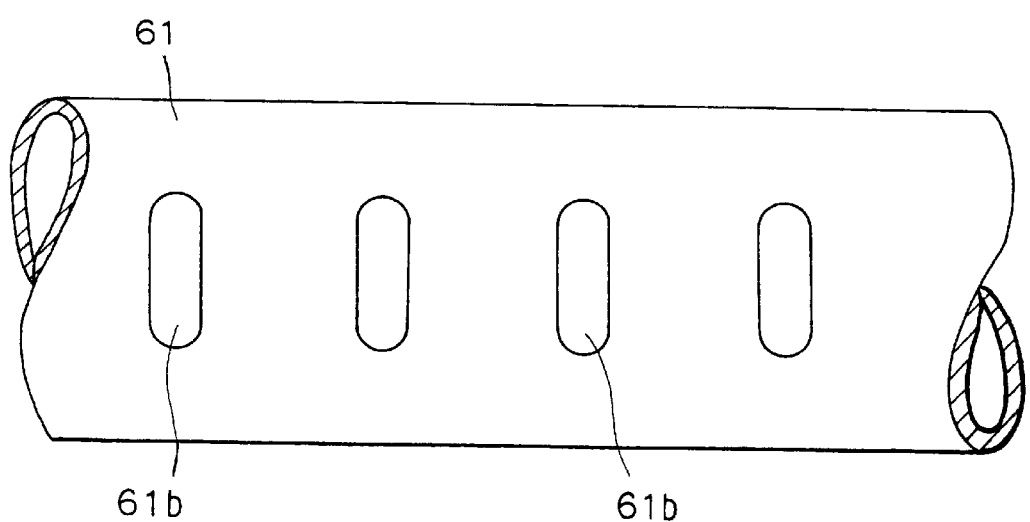
FIG. 16 is a view showing a modification example of the resist pipe according to the first embodiment of the present invention.

Further, in the aforesaid first embodiment, as the nozzle of the resist pipe 61, circular nozzles 61a to 61c are used, but other than these, it is suitable to use, for example, a nozzle 61b in a slit form as shown in FIG. 16.

In the aforesaid first embodiment, the openings 63a . . . of the gas pipe 63 are placed at the same positions as the openings 61a . . . of the resist pipe 61 with respect to the cross direction of the substrate G (the Y direction), and the numbers of the openings are different from each other, but it may be suitable that the numbers thereof are the same as shown in FIG. 21. In that situation, liquid can be coated with higher density (shown in FIG. 2) compared with the liquid coating state in the aforesaid first embodiment (shown in FIG. 10). There the coating solution is not in a form of mounds, but in a form of crests and troughs as a result that the surface tension causes the resist solutions discharged from the openings 61a . . . of the resist pipe 61 to lightly join to one another on the coating surface of the substrate.

Figure 17:
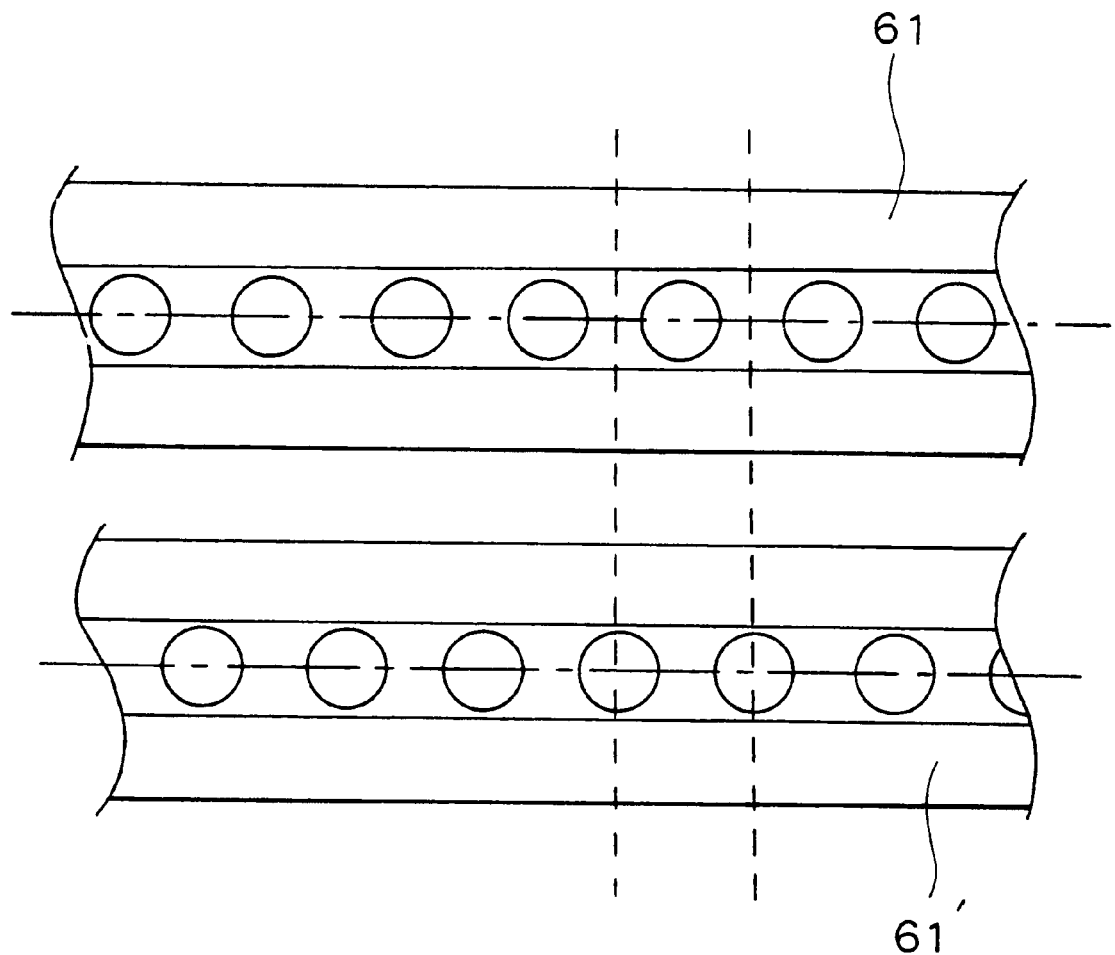
FIG. 17 is a view showing a modification example of the resist pipe according to the first embodiment of the present invention.

Further, in the aforesaid first embodiment, only one of the resist pipe 61 is used, but it is suitable to include two or more resist pipes 61 and 61' across the moving direction of the substrate G. In that situation, as shown in FIG. 17, it is preferable to alternate the opening positions of the resist nozzles 61a between these two resist pipes 61 and 61'. In the arrangement as above, the density of the bumps on the surface of the resist solution supplied on the substrate G are increased, and it is preferable because the film thickness is easily made uniform in the subsequent thin film making step.

Figure 18:
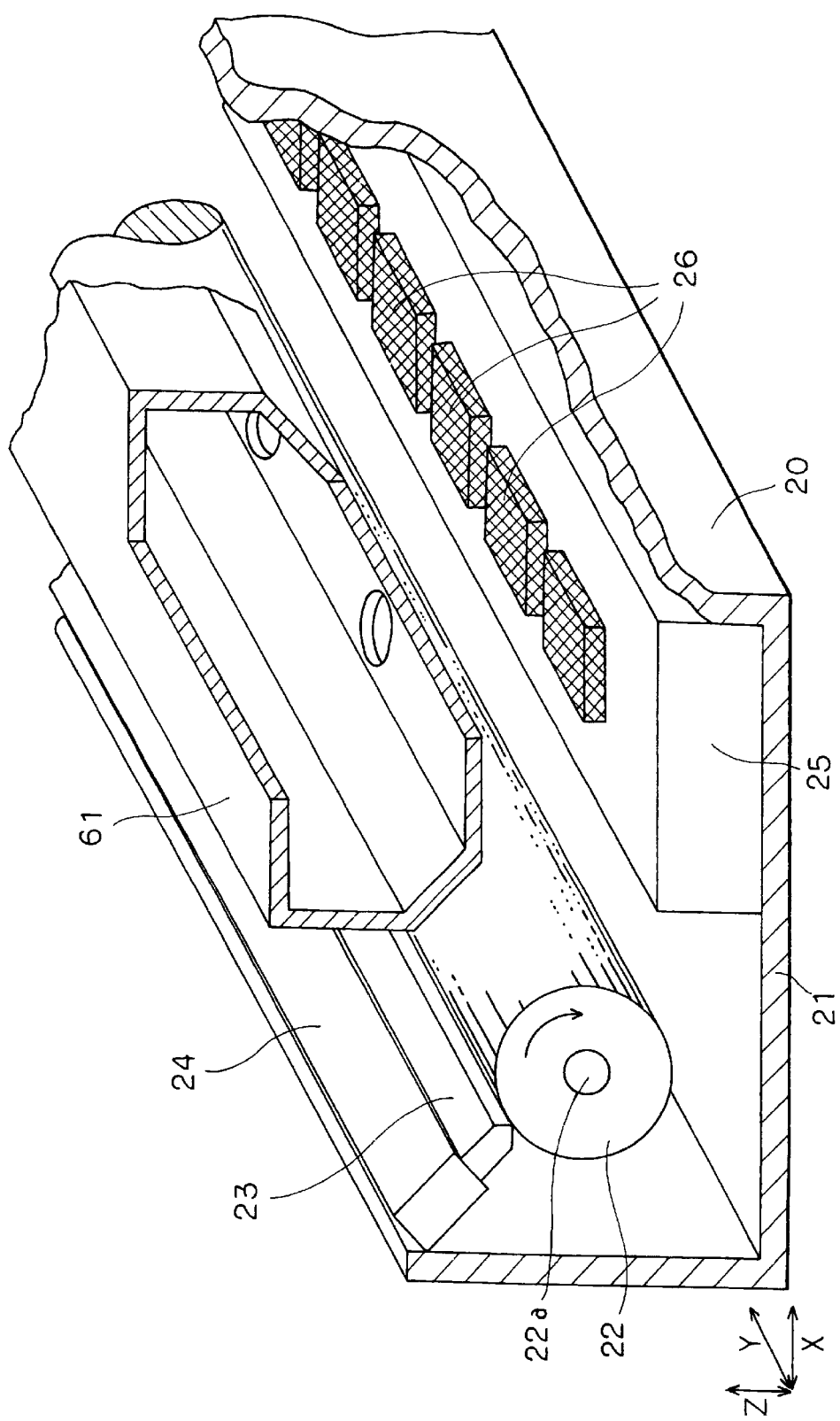
FIG. 18 is a expanded perspective view of a nozzle check mechanism according to the first embodiment of the present invention.

Next, a nozzle check mechanism equipped at the resist coating unit in this embodiment will be explained. FIG. 18 is a perspective view showing a situation in which a solvent bath 20 is cut.

As shown in FIG. 18, the solvent bath 20 includes a housing 21 with a rectangular section, and a cleaning roll 22 is placed inside the housing 21 at the left side in the X direction of FIG. 18, and a discharge stand 25 is placed at the right side in the X direction of the same drawing.

The cleaning roll 22 extends over the Y direction of the housing 21, and has a size a little larger than the portion where the resist nozzles 61a to 61c are placed in the resist pipe 61. The cleaning roll is designed to rotate around a rotational shaft 22a fixed at the housing 21, and is rotated in a direction of the arrow in the drawing by driving force transmitted from a driving force transmission mechanism not shown. Though omitted in FIG. 18, solvent is housed in the solvent bath 20, and the height of the liquid surface is such that the top surfaces of pressure sensors 26, 26 . . . on the discharge stand 25 described below are exposed.

At the position diagonal to the left of the cleaning roll 22 in FIG. 18, a wiper 23 for removing the resist solution on the surface of the cleaning roll 22 is placed. The wiper 23 is housed in a wiper box 24 so as to be able to appear and retreat, so that the head of the wiper 23 can be abutted to the surface of the cleaning roll 22 and housed in the wiper box 24 in response to a signal from the control section 100.

Meanwhile, the discharge stand 25 is a member in a form of a low fence, placed at the right side of the housing 21 in the drawing, and on the top thereof, a plurality of pressure sensors 26, 26, . . . are placed over the Y direction. These pressure sensors 26, 26, . . . are placed at the positions corresponding to the respective resist nozzles 61a to 61c, so that each of the pressure sensors 26, 26, . . . opposes each of the resist nozzles 61a to 61c when the resist pipe 61 is at the position just above the discharge stand 25. Each of these pressure sensors 26, 26, . . . is separately connected to the control section 100, so that the discharge pressure detected at each of these pressure sensors 26, 26, . . . is recognized by the control section 100.

Next, the operation of the nozzle check mechanism will be explained.

When resist discharge onto the substrate G is completed, the control section 100 drives the moving device to move the resist pipe 61 up to the cleaning position, specifically, up to the position at which the resist nozzles 61a to 61c are just above the rotational shaft 22a of the cleaning roll 22. In this state, resist solution is discharged toward the surface of the cleaning roll 22 from the resist nozzles 61a to 61c, and attached on the surface of the cleaning roll 22. At this time, the cleaning roll 22 is rotating, and rolls up the excess resist solution attached on the surfaces of the resist nozzles 61a to 61c with the resist solution attached thereon as the front end. Meanwhile, the wiper 23 protrudes out of the wiper box 24, and the front end thereof abuts to the cleaning roll surface. Accordingly, excess resist solution rolled up from the resist nozzles 61a to 61c is scraped off with the wiper 23, and the cleaning roll surface without resist solution thereon opposes the resist nozzles 61a to 61c to roll up and remove the excessive resist solution once again.

After performing the cleaning operation at the cleaning position for a predetermined period of time, the resist pipe 61 is moved in the rightward direction in the drawing to move up to the standby position, specifically, the position at which the resist nozzles 61a to 61c oppose the pressure sensor 26, 26, . . . . In this position, dummy dispense from the resist nozzles 61a to 61c, specifically, discharge of the resist solution, is performed, and the resist solution is discharged toward the pressure sensors 26, 26, . . . . Each of the pressure sensors 26, 26, . . . detects the discharge pressure of the resist solution discharged form each of the resist nozzles 61a to 61c, and sends the result to the control section 100.

In the control section 100, the discharge pressure of each of the resist nozzles 61a to 61c is recognized based on the signals from the pressure sensors 26, 26, . . . . It is determined whether each discharge pressure is in a prescribed range or not, and the condition of each of the resist nozzles 61a to 61c is grasped. As a result, when it is determined any one of the resist nozzles 61a to 61c is clogged since the discharge pressure is low, the resist pipe 61 is returned to the aforesaid cleaning position once again to perform the cleaning operation again. The operation is repeated until the result of the dummy dispense at the standby position turns out good.

On the other hand, as a result of the dummy dispense, when any one of the resist nozzles 61a to 61c is not in an abnormal condition, the resist pipe 61 is moved in the X direction in the drawing and made available for supplying resist solution onto the substrate G.

When the nozzle 21a is in an abnormal condition, an alarm with a light or sound may be given.

As described above, according to the nozzle check mechanism, it can be detected whether the resist nozzles 61a to 61c are clogged in the step before the resist is discharged onto the substrate G, therefore preventing the production of a defect resulting from an error in discharge onto the substrate G, improving yield, and reducing the manufacturing cost per product.

(A Second Embodiment)

Next, a coating unit according to the second embodiment of the present invention will be explained.

In the coating unit according to the second embodiment, the explanation of the elements common to those in the coating unit according to the aforesaid first embodiment will be omitted.

In the coating treatment unit (COT) according to the second embodiment, instead of providing an actuator (vibrating element) on the surface abutting to the substrate G on the top of the spin chuck 15, the spin chuck 15 is rotated at high speed, thereby making the film thickness of resist coating on the substrate G smaller and uniform.

In the coating treatment unit (COT) according to the second embodiment, while the resist pipe 61 is moved in the X direction in FIG. 5, with the substrate G being held on the spin chuck 15, resist solution is discharged onto the substrate.

The resist coating film formed on the substrate in this state is a coating film with a nonuniform thickness as shown in FIG. 11.

Subsequently, voltage is applied to the motor 16 driving the aforesaid spin chuck 15 from the control section, thereby rotating the substrate G and the resist coating film formed on the surface at high speed. As a result of the rotation at high speed, the thickness of the resist coating film is made thinner and uniform, and the resist coating film with a thinner and uniform thickness as shown in FIG. 13 is obtained.

In the second embodiment, the substrate G is rotated at high speed with use of the spin chuck 15, but before rotated at high speed, the spin chuck 15 itself is normally and reversely rotated to a minute angle in a short cycle around the rotational shaft 18, thereby oscillating the substrate G as with the aforesaid actuator. In this situation, it is not necessary to use an additional member like an actuator, therefore it is preferable in structure and cost.

(A Third Embodiment)

Next, a coating unit according to the third embodiment of the present invention will be explained.

In the coating unit according to the third embodiment, the explanation of the elements common to those in the coating unit according to the aforesaid embodiment will be omitted.

FIG. 18 is a vertical sectional view schematically showing the structure of the surroundings of the resist pipe 61 of the coating treatment unit (COT) according to the second embodiment of the present invention.

In this coating treatment unit (COT), resist solution is intermittently supplied from the resist pipe 61, and the solvent pipe 62 is placed upstream (left side in the drawing) from the resist pipe 61 in the moving direction of the substrate G.

As shown in FIG. 18, in the coating treatment unit (COT), solvent is discharged from the solvent nozzle 62a onto the surface of the substrate G at first, and thereafter the resist solution is discharged.

The situation in which the resist solution discharged from the resist nozzle 61a is made thinner and uniform on the substrate G is explained in proper time sequence below.

Figure 19:
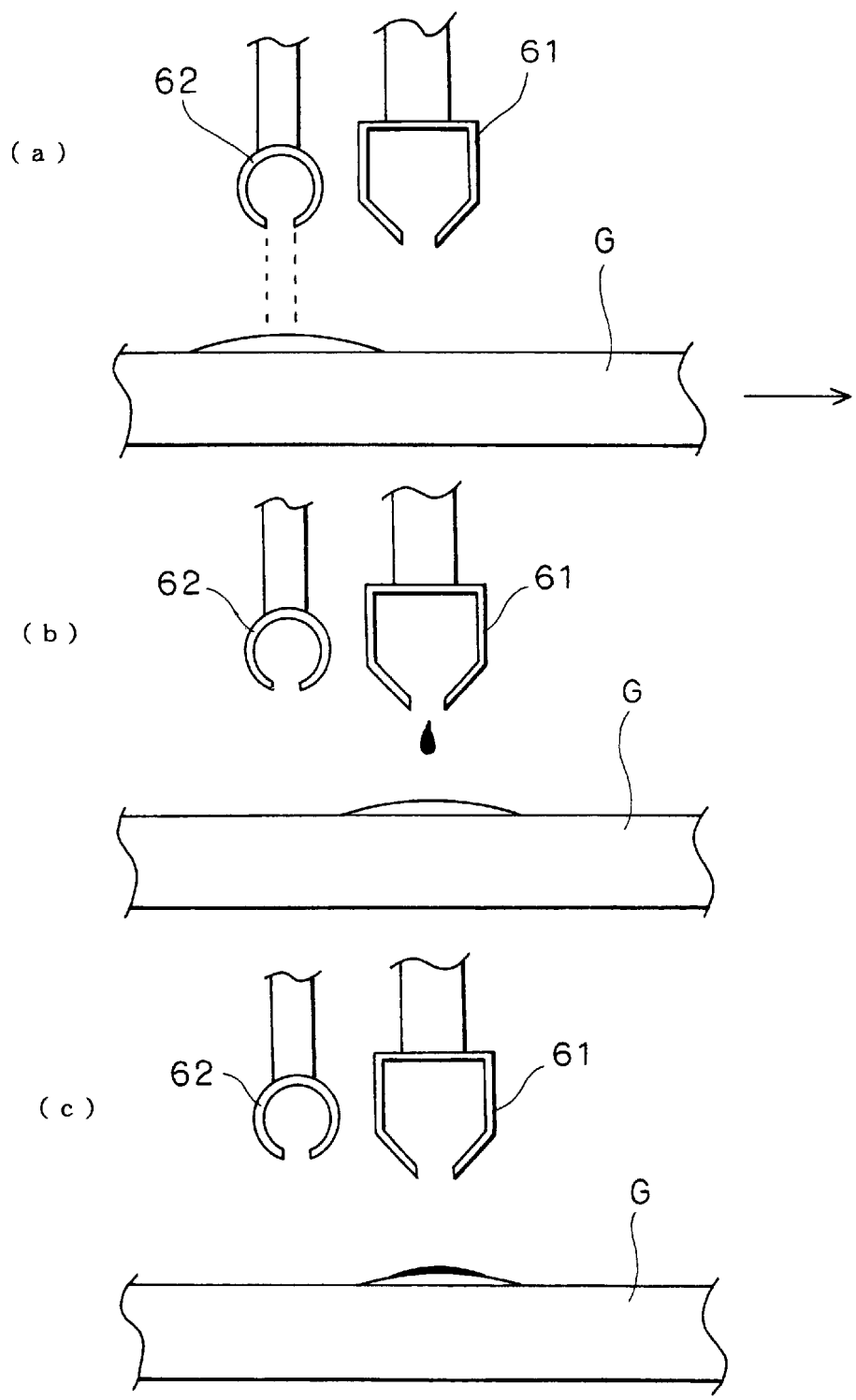
FIGS. 19(a), 19(b), and 19(c) are vertical sectional views showing an operational condition of a resist coating unit according to a third embodiment of the present invention.
Figure 20:
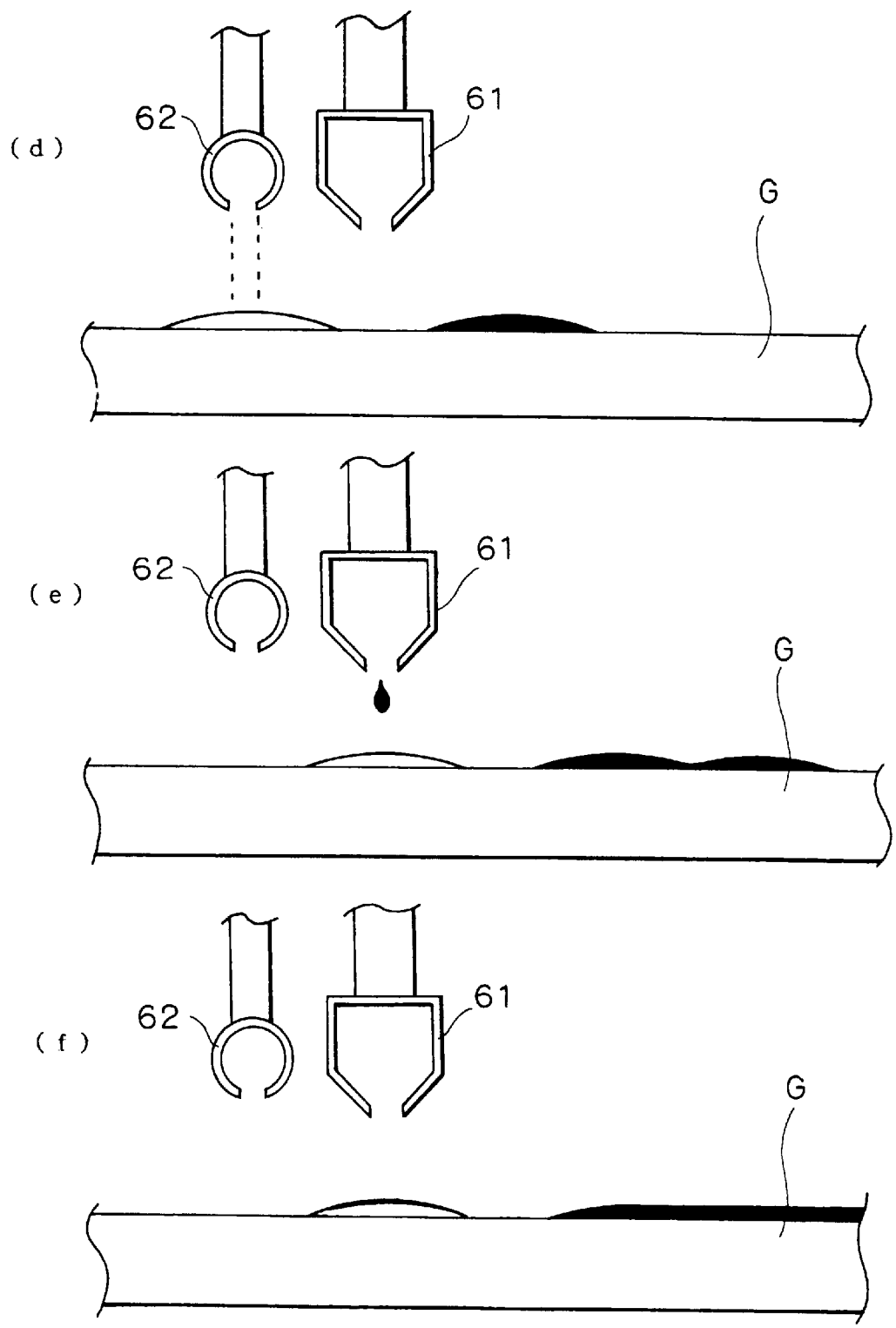
FIGS. 20(d), 20(e), and 20(f) are vertical sectional views showing an operational condition of the resist coating unit according to the third embodiment of the present invention.
Figure 22:
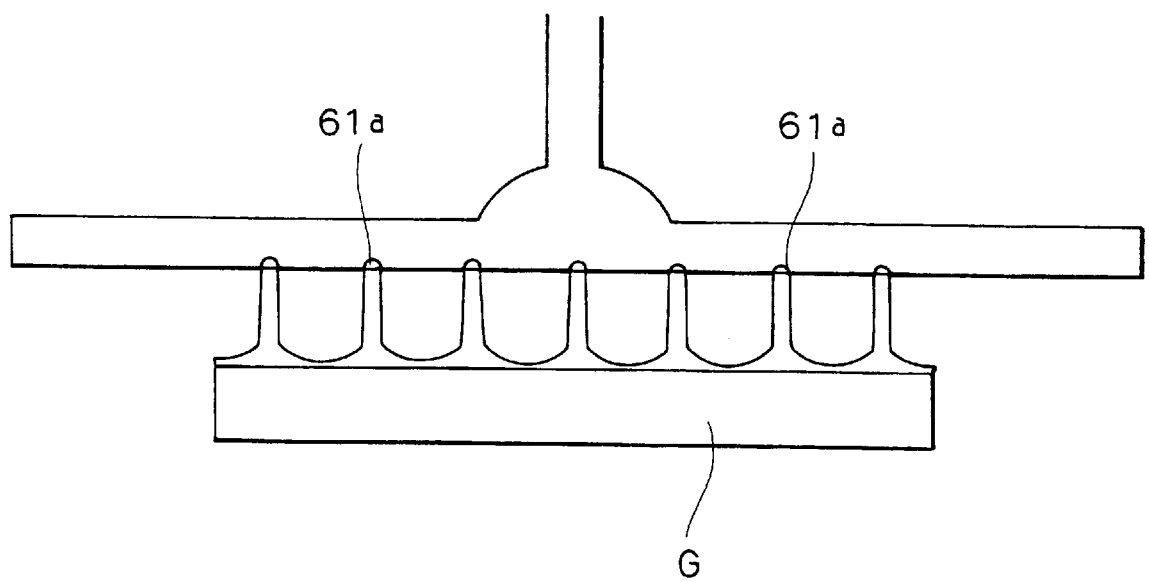
FIG. 22 is a vertical sectional view of a resist coating unit according to another embodiment of the present invention.

FIG. 19(*a*) to FIG. 20(*f*) are vertical sectional views schematically showing a change of the resist solution discharged from the resist pipe 61 until it is made a thin film on the substrate G.

A predetermined amount of solvent is discharged onto the top surface of the substrate G held on the spin chuck 15 from the solvent nozzle 62. The solvent discharged spreads on the surface of the substrate G to form a thin solvent layer.

Subsequently, the resist pipe 61 and the solvent pipe 62 are moved in the leftward direction in the drawing. For convenience of explanation, in FIGS. 19(a), 19(b), and 19(c), and FIGS. 20(d), 20(e), and 20(f), it is assumed that the substrate G is moved in the rightward direction in the drawing.

As the result of the aforesaid movement, the substrate G moves in the rightward direction in the drawings relatively to the resist pipe 61 and the solvent pipe 62. As the result of the movement, the aforesaid solvent layer moves up to the position just below the resist nozzle 61a. In this situation, resist solution is discharged from the resist nozzle 61a (FIG. 19(b)). The resist solution discharged from the resist nozzle 61a spreads over the solvent layer as soon as it abuts to the aforesaid solvent layer, and spreads across the surface of the substrate G along the solvent layer (FIG. 19(c)).

Thereafter, the aforesaid solvent layer and the aforesaid resist solution are completely dissolved to form a resist coating film spread over the surface of the substrate G (FIG. 20(d)).

Similarly, solvent is discharged at the left side portion of the substrate G in the drawing to form a thin solvent layer, resist solution is discharged thereto, thin resist coating films are successively formed in the leftward direction from the right of the drawing (FIG. 20(e)). Meanwhile, during this period, the resist coating films formed on the substrate G spreads over the substrate G, the adjacent resist coating films in the X and the Y directions overlaps with one another at the end portions thereof to be integrated (FIG. 20(f)).

In this way, the resist coating films formed by the resist solution intermittently discharged on the substrate G join to one another, with the film thickness being made smaller and uniform, thus forming a resist coating film with smaller and uniform thickness on the surface of the substrate G (FIG. 20(f)).

Thereafter, the resist coating film is oscillated by the aforesaid actuator AC, or the substrate G is rotated at high speed with the spin chuck 15, thereby making the film thickness smaller and uniform.

As particularly described above, an operation of supplying a treatment agent, and an operation of thin film making of the treatment agent are separately performed, and while the treatment agent is supplied with treatment supplying means, thin filmmaking of the treatment agent is performed with thin film making means. As a result, requirements of mechanical accuracy and operational accuracy for the step of each of the aforementioned operations are relaxed.

Specifically, it is not necessary to control the shapes and the sizes of the nozzles, a space between the treatment agent nozzle and the substrate to be treated, and the like as strictly as in the aforesaid continuous slot.

A treatment agent is supplied onto the surface of the substrate to be treated at a plurality of positions, and therefore a treatment agent with comparatively lower viscosity can be used. Consequently, the treatment agent is difficult to dry with a high content of solvent, therefore making it difficult to clog the nozzles.

Further, the viscosity of the treatment agent has less effect on the film thickness, therefore making it easy to control the viscosity of the treatment agent.

In addition, since a treatment agent with low viscosity can be used, when thin film making is performed by rotating the treatment agent after the coating operation, the coating film can be made thinner at low rpm, therefore making it applicable to a large LCD substrate.

Further, with low viscosity, the treatment agent is easy to remove even if it is attached on the rotor cup.

Furthermore, the treatment agent is supplied separately at a plurality of positions, therefore making it unnecessary to use a treatment agent nozzle including a large opening as a slot, and preventing the treatment agent nozzle increasing in size.

In addition, since thin film making is achieved by being rotated in an enclosed state, airflow is not disturbed, and a coating film with uniform thickness can be obtained.

Further, as thin film making means, means for oscillating the aforesaid coated substrate is employed, therefore enabling thin film making with reliability in a simple construction.

It should be noted that "oscillation" described here includes a vibration in a linear direction with use of an actuator (vibrating element) or the like, and an angular vibration of a spin chuck in a range of a minute angle.

Means for rotating the aforesaid coated substrate is employed as thin film making means, thereby enabling thin film making with reliability in a simple construction.

For example, if the spin chuck is used, a conventional type of apparatus can be used, and it is not necessary to add a new component or element, therefore eliminating a need for new investment in equipment, thus almost eliminating an increase in manufacturing cost.

When using a spin chuck, it is possible to spin off and remove an excess treatment agent by rotating the spin chuck at high speed after making oscillation by an angular vibration within a minute angle after coating the treatment agent.

The treatment agents supplied adjacently to one another are supplied at such intervals that the treatment agents integrate with one another on the surface of the treated substrate by thin film making means. As a result, the treatment agents supplied onto the substrate to be treated are surely integrated, therefore forming a coating film with uniform and smaller thickness much more reliably.

By further including means for previously supplying solvent onto the surface of the substrate to be treated before a treatment agent is supplied, the surface of the substrate to be treated is previously made wet with solvent by supplying the solvent, thereby increasing comformability of the treatment agent with the substrate to be treated, and quickly spreading the treatment agent, which runs on the surface of the substrate to be treated with the solvent layer between them, therefore surely making the coating film with a uniform thickness.

As means for oscillating the treated substrate, the actuator placed at the aforesaid holding member and the control section driving the actuator are included, therefore surely making the coating film uniform in simple structure.

The rotatable spin chuck is used as holding means, and the spin chuck is used as thin film making means. Therefore the coating film can be surely made uniform without adding a component thereto.

Further, it is possible to use the spin chuck as the aforesaid oscillating means, and to rotate it at high speed after the spin chuck makes an angular vibration within a minute angle range. As a result, the coating film is made further more uniform and thinner.

Further the solvent nozzle for supplying solvent onto the surface of the aforesaid substrate to be treated is included, and the surface of the substrate to be treated is previously made wet with solvent by supplying the solvent, thereby increasing comformability of the treatment agent with the substrate to be treated, and quickly spreading the treatment agent, which runs on the surface of the substrate to be treated with the solvent layer between them, therefore surely making the coating film uniform.

The treatment agents supplied adjacently to one another are supplied at such intervals that the treatment agents are integrated with one another on the surface of the substrate to be treated by thin film making means. As a result, the treatment agents supplied onto the substrate to be treated are surely integrated, therefore forming a coating film with uniform and smaller thickness much more reliably.

The standby position is provided adjacently to the holding member or the spin chuck, and the pressure sensor is placed on the surface of the standby position, opposing the aforesaid treatment agent nozzles to detect the discharge pressure of each treatment agent nozzle. A monitoring section for monitoring the operational condition of each of the aforesaid treatment agent nozzles based on the detected discharge pressure is provided, and therefore the operational condition of each treatment agent nozzle can be always monitored with the monitoring section, and the treatment agent nozzle clogged is discovered as quickly as possible if any one of the treatment agent nozzles are clogged, which prevents the production from proceeding with a problem occurring to the treatment agent nozzle, therefore slowdown in production is eliminated, and manufacturing efficiency and cost are improved.

An operation of supplying a treatment agent, and an operation of thin film making of the treatment agent are separately performed, and while the treatment agent is supplied with treatment supplying means, thin film making of the treatment agent is performed with thin filmmaking means, therefore relaxing requirements of mechanical accuracy and operational accuracy for the step of each of the aforementioned operations.

A treatment agent is supplied onto the surface of the substrate to be treated at a plurality of positions, and therefore a treatment agent with comparatively lower viscosity can be used. Consequently, the treatment agent is difficult to dry with a high content of solvent, therefore making it difficult to clog the nozzles.

Further, the viscosity of the treatment agent has less effect on the film thickness, therefore making it easy to control the viscosity of the treatment agent.

In addition, since a treatment agent with low viscosity can be used, when thin film making is performed by rotating the treatment agent after treatment, the coating film can be made thinner at low rpm, therefore making it applicable to a large LCD substrate.

Further, with low viscosity, the treatment agent is easy to remove even if it is attached on the rotor cup.

Furthermore, the treatment agent is supplied separately at a plurality of positions, therefore making it unnecessary to use a treatment agent nozzle including a large opening as a slot, and preventing the treatment agent nozzle from increasing in size.

In addition, since thin film making is achieved by being rotated in an enclosed state, airflow is not disturbed, and a coating film with uniform thickness can be obtained.

Further, a step for oscillating the aforesaid treated substrate to make the thickness of the aforesaid treatment agent uniform and smaller is included, therefore more securely forming a coating film with uniform and smaller thickness.

Next, the meaning of the terms will be explained.

"a plurality of positions at predetermined intervals" at which coating solution is supplied is on the assumption that the supplied treatment agent itself spreads over the surface of the substrate to be treated, and does not mean the entire top surface.

For example, if lateral spread is assumed, the agent is supplied in a linear form, and if spread in all directions is assumed, it is discharged in a dot form.

"supply" includes both of continuous supply and intermittent supply.

"treatment agent" includes various liquids with high to low viscosity, one for forming a coating film, for cleaning the substrate, solvent, treatment liquid, and so on.

"relatively move" includes moving supplying means without moving holding means, or moving holding means without moving supplying means, as well as moving both means in the directions opposite to each other, and moving both means in the same direction at different speeds. The moving direction is generally linear, but rotational moving and snaking moving are included.

What is claimed is:

1. A coating apparatus, comprising:

a holding member for holding a substrate to be treated;

a plurality of treatment agent nozzles facing the surface of said substrate to be treated, and provided at predetermined intervals over a first direction across the surface of said substrate to be treated;

a treatment agent supplying system for supplying treatment agent to said treatment agent nozzles;

a guide provided in a second direction different from the first direction, and movably supporting said holding member or said treatment agent nozzles;

a moving system for moving said holding member and said treatment agent nozzles relatively to one another;

an actuator provided at said holding member;

a container for housing said holding member and said actuator;

a lid for tightly covering said container;

a control section for synchronously driving said treatment agent supplying system, said moving system, and said actuator;

a standby position provided adjacently to said holding member;

a pressure sensor provided on the surface opposing said treatment agent nozzles in said standby position, and detecting the discharge pressure of each treatment agent nozzle; and a monitoring device for monitoring the operational condition of each of said treatment agent nozzles based on the detected pressure.

2. The coating apparatus as set forth in claim 1, further comprising:

a solvent nozzle provided adjacently to and upstream of said treatment nozzles in a moving direction of the substrate to be treated;

a solvent supplying system for supplying solvent to said solvent nozzle; and a control section for driving said moving system.

3. The coating apparatus as set forth in claim 1,
wherein an interval between adjacently supplied treatment agent is such that the adjacently supplied treatment agent is integrated on the surface of said substrate to be treated by said thin film making means.

4. A coating apparatus, comprising:

a spin chuck for rotatably holding a substrate to be treated;

a container for housing said spin chuck;

a lid for tightly covering said container;

a plurality of treatment agent nozzles facing the surface of said substrate to be treated, and provided at predetermined intervals over a first direction across the surface of said substrate to be treated;

a treatment agent supplying system for supplying treatment agent to said treatment agent nozzles;

a guide provided in a second direction different from the first direction, and movably supporting said spin chuck or said treatment agent nozzles;

a moving system for moving said spin chuck and said treatment agent nozzles relatively to one another;

a control section for synchronously driving said treatment agent supplying system, said moving system, and said spin chuck;

a standby position provided adjacently to said spin chuck;

a pressure sensor provided on the surface opposing said treatment agent nozzles in said standby position, and detecting the discharge pressure of each treatment agent nozzle; and a monitoring device for monitoring the operational condition of each of said treatment agent nozzles based on the detected discharge pressure.

5. The coating apparatus as set forth in claim 4, further comprising:

a solvent nozzle provided adjacently to and upstream of said treatment nozzles in a moving direction of the substrate to be treated;

a solvent supplying system for supplying solvent to said solvent nozzle; and a control section for driving said moving system.

6. The coating apparatus as set forth in claim 4,
wherein an interval between adjacently supplied treatment agent is such that the adjacently supplied treatment agent is integrated on the surface of said substrate to be treated by said thin film making means.

* * * * *